(12) United States Patent
Chen et al.

(10) Patent No.: US 11,227,823 B2
(45) Date of Patent: Jan. 18, 2022

(54) WIRING STRUCTURE

(71) Applicant: Advanced Semiconductor Engineering, Inc., Kaohsiung (TW)

(72) Inventors: Tang-Yuan Chen, Kaohsiung (TW); Chih-Pin Hung, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 0 days.

(21) Appl. No.: 16/853,396

(22) Filed: Apr. 20, 2020

(65) Prior Publication Data

US 2021/0327796 A1 Oct. 21, 2021

(51) Int. Cl.
| | |
|---|---|
| H05K 1/11 | (2006.01) |
| H05K 1/14 | (2006.01) |
| H01L 23/498 | (2006.01) |
| H01L 23/00 | (2006.01) |
| H01L 23/538 | (2006.01) |
| H05K 1/02 | (2006.01) |

(52) U.S. Cl.
CPC .... H01L 23/49822 (2013.01); H01L 23/5383 (2013.01); H01L 24/20 (2013.01); H05K 1/111 (2013.01); H05K 1/14 (2013.01); H01L 24/13 (2013.01); H05K 1/0284 (2013.01); H05K 1/0298 (2013.01)

(58) Field of Classification Search
CPC ........... H01L 23/49822; H01L 23/5383; H01L 24/20; H01L 24/13
See application file for complete search history.

(56) References Cited

U.S. PATENT DOCUMENTS

| | | | |
|---|---|---|---|
| 9,334,576 B2* | 5/2016 | Miyazawa | ............... C25D 5/10 |
| 2013/0192879 A1* | 8/2013 | Morita | ..................... H05K 3/10 |
| | | | 174/251 |
| 2013/0214423 A1* | 8/2013 | Sadaka | .............. H01L 21/6835 |
| | | | 257/774 |
| 2015/0357276 A1* | 12/2015 | Shimizu | ............... H05K 3/0023 |
| | | | 361/783 |
| 2016/0064254 A1* | 3/2016 | Hu | ........................ H01L 21/486 |
| | | | 174/258 |
| 2018/0061765 A1* | 3/2018 | Gozu | .................. H01L 23/5383 |
| 2019/0139853 A1* | 5/2019 | Oh | ......................... H01L 24/20 |
| 2019/0230791 A1* | 7/2019 | Kitajo | .................. H05K 3/0035 |
| 2020/0211945 A1* | 7/2020 | Huang | ............. H01L 23/49838 |
| 2020/0303314 A1* | 9/2020 | Kang | ..................... H01L 23/66 |

* cited by examiner

*Primary Examiner* — Ishwarbhai B Patel
(74) *Attorney, Agent, or Firm* — Foley & Lardner LLP

(57) ABSTRACT

A wiring structure is provided. The wiring structure includes an upper redistribution structure, a lower redistribution structure, a conductive structure, an upper bonding layer and a lower bonding layer. The conductive structure is disposed between and electrically connected to the upper redistribution structure and the lower redistribution structure. The upper bonding layer is disposed between the upper redistribution structure and the conductive structure to bond the upper redistribution structure and the conductive structure together. The lower bonding layer is disposed between the lower redistribution structure and the conductive structure to bond the lower redistribution structure and the conductive structure together.

20 Claims, 14 Drawing Sheets

WIRING STRUCTURE

BACKGROUND

1. Field of the Disclosure

The present disclosure relates to a wiring structure, and to a wiring structure including a conductive structure disposed between two redistribution structures.

2. Description of the Related Art

As for a high-end product such as a flip chip ball grid array (FCBGA) package for 5G high-speed transmission, a multi-layer substrate may be required to transmit high-speed signals. The multi-layer substrate generally includes a plurality of dielectric layers and a plurality of circuit layers. Thus, mismatch issues of coefficient of thermal expansion (CTE) may exist between the dielectric layers and the circuit layers, thereby generating significantly warpage during thermal processing. In addition, a thickness of such multi-layer substrate may correspondingly increase, and a yield of such multi-layer substrate may decrease.

SUMMARY

In some embodiments, a wiring structure includes an upper redistribution structure, a lower redistribution structure, a conductive structure, an upper bonding layer and a lower bonding layer. The conductive structure is disposed between and electrically connected to the upper redistribution structure and the lower redistribution structure. The upper bonding layer is disposed between the upper redistribution structure and the conductive structure to bond the upper redistribution structure and the conductive structure together. The lower bonding layer is disposed between the lower redistribution structure and the conductive structure to bond the lower redistribution structure and the conductive structure together.

In some embodiments, a wiring structure includes an upper redistribution structure, a lower redistribution structure and a conductive structure. The upper redistribution structure includes a plurality of upper circuit layers. The lower redistribution structure includes at least one lower circuit layer. A number of the at least one lower circuit layer is different from a number of the upper circuit layers of the upper redistribution structure. The conductive structure is disposed between the upper redistribution structure and the lower redistribution structure to electrically connect the upper redistribution structure and the lower redistribution structure.

In some embodiments, a wiring structure includes a low density conductive structure, a first high density redistribution structure and a second high density redistribution structure. The first high density redistribution structure includes a first dielectric structure and a first redistribution layer embedded in the first dielectric structure. The first high density redistribution structure is attached to and electrically connected to a first surface of the low density conductive structure. The second high density redistribution structure includes a second dielectric structure and a second redistribution layer embedded in the second dielectric structure. The second high density redistribution structure is attached to and electrically connected to a second surface of the low density conductive structure. A ratio of a total thickness of the first dielectric structure to a total thickness of the second dielectric structure is 0.58 to 3. A ratio of a total thickness of the first redistribution layer to a total thickness of the second redistribution layer is 0.3 to 3.

BRIEF DESCRIPTION OF THE DRAWINGS

Aspects of some embodiments of the present disclosure are readily understood from the following detailed description when read with the accompanying figures. It is noted that various structures may not be drawn to scale, and dimensions of the various structures may be arbitrarily increased or reduced for clarity of discussion.

DETAILED DESCRIPTION

Figure 1:
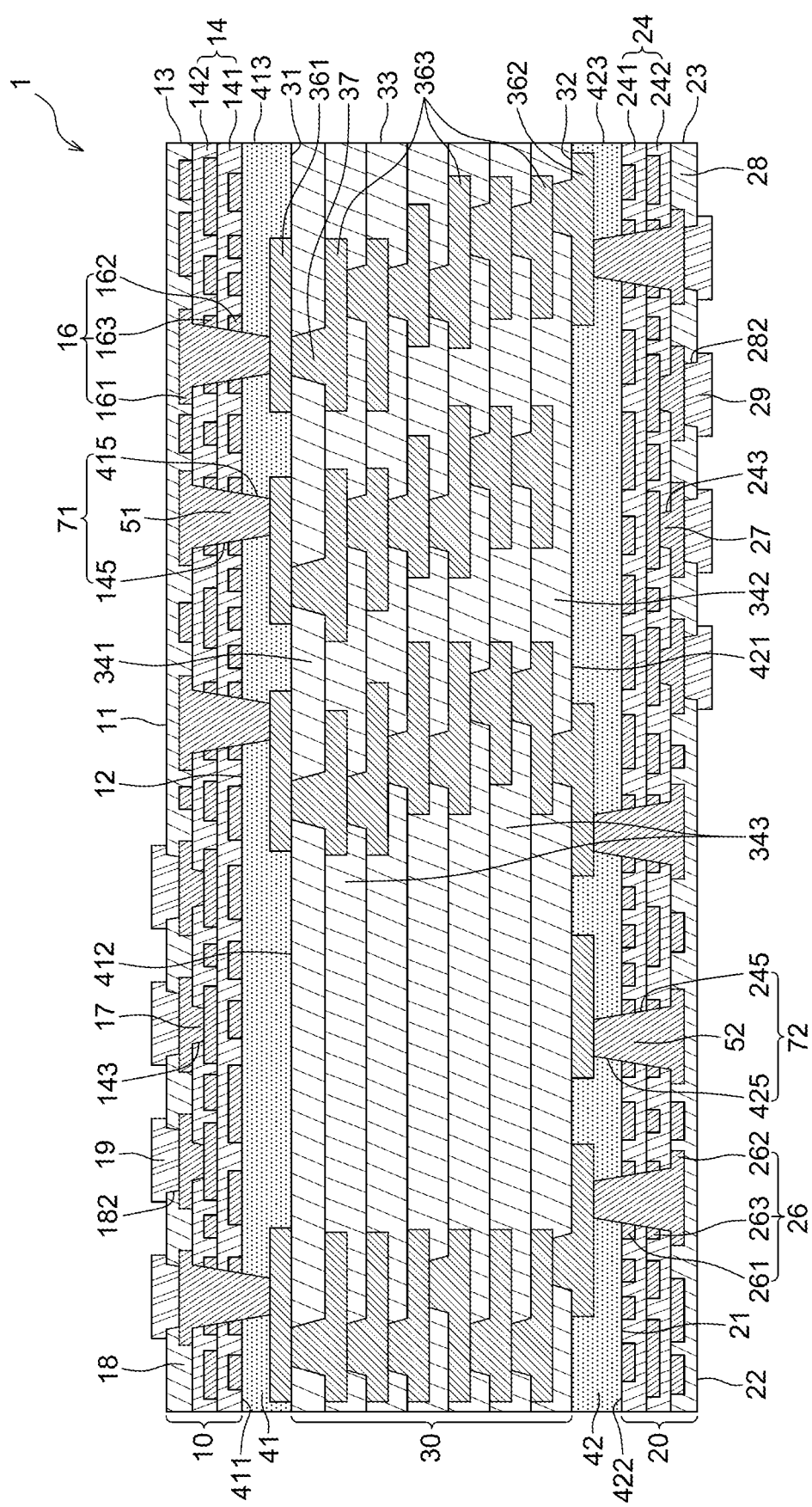
FIG. 1 illustrates a cross-sectional view of a wiring structure according to some embodiments of the present disclosure.

Common reference numerals are used throughout the drawings and the detailed description to indicate the same or similar components. Embodiments of the present disclosure will be readily understood from the following detailed description taken in conjunction with the accompanying drawings.

The following disclosure provides many different embodiments, or examples, for implementing different features of the provided subject matter. Specific examples of components and arrangements are described below to explain certain aspects of the present disclosure. These are, of course, merely examples and are not intended to be limiting. For example, the formation of a first feature over or on a second feature in the description that follows may include embodiments in which the first and second features are formed or disposed in direct contact, and may also include embodiments in which additional features may be formed or disposed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

FIG. 1 illustrates a cross-sectional view of a wiring structure 1 according to some embodiments of the present disclosure. The wiring structure 1 includes an upper redistribution structure 10, a lower redistribution structure 20, a conductive structure 30, an upper bonding layer 41, a lower bonding layer 42, at least one upper conductive via 51 and at least one lower conductive via 52. In some embodiments, the upper redistribution structure 10 and the lower redistribution structure 20 may be, for example, a high density redistribution structure or a bumping level redistribution structure. The conductive structure 30 may be, for example, a low density conductive structure or a substrate level conductive structure. That is, a line width/line space (L/S) of a circuit layer of the upper redistribution structure 10 and a line width/line space (L/S) of a circuit layer of the lower redistribution structure 20 may be less than about 10 μm/10 μm, less than or equal to about 5 μm/5 μm, or less than or equal to about 2 μm/2 μm, and a line width/line space (L/S) of a circuit layer of the conductive structure 30 may be greater than or equal to about 10 μm/10 μm, or greater than or equal to about 15 μm/15 m.

In some embodiments, a distribution density of a circuit line (including, for example, a trace or a pad) of the high density redistribution structure (e.g., the upper redistribution structure 10 and the lower redistribution structure 20) is greater than a distribution density of a circuit line of the low density conductive structure (e.g., the conductive structure 30). That is, the count of the circuit line (including, for example, a trace or a pad) in a unit area of the high density redistribution structure is greater than the count of the circuit line in an equal unit area of the low density conductive structure, such as about 1.2 times or greater, about 1.5 times or greater, or about 2 times, or about 5 times or greater. Alternatively, a line width/line space (L/S) of the circuit line of the high density redistribution structure is less than a L/S of the circuit line of the low density conductive structure, such as about 90% or less, about 50% or less, or about 20% or less.

The upper redistribution structure 10 may be also referred to as "a first high density redistribution structure". The upper redistribution structure 10 (i.e., the first high density redistribution structure) has an upper surface 11, a lower surface 12 opposite to the upper surface 11 and a peripheral surface 13 extending between the upper surface 11 and lower surface 12. In addition, the upper redistribution structure 10 (i.e., the first high density redistribution structure) may include an upper dielectric structure 14, an upper redistribution layer 16, a plurality of upper inner vias 17, an upper protection layer 18 and a plurality of upper connecting pads 19. The upper dielectric structure 14 may be also referred to as "a first dielectric structure," and the upper redistribution layer 16 may be also referred to as "a first redistribution layer."

The upper dielectric structure 14 (i.e., the first dielectric structure) may include a plurality of dielectric layers (including, for example, a first dielectric layer 141 and a second dielectric layer 142) and may define at least one through hole 145. The dielectric layers (e.g., the first dielectric layer 141 and the second dielectric layer 142) are stacked to each other. For example, the second dielectric layer 142 is disposed on the first dielectric layer 141. In some embodiments, the dielectric layers (e.g., the first dielectric layer 141 and the second dielectric layer 142) may be made of a cured photoimageable dielectric material such as epoxy or polyimide (PI) including photoinitiators. That is, a material of the upper dielectric structure 14 (i.e., the first dielectric structure) may be cured photoimageable dielectric material. The through hole 145 extends through the upper dielectric structure 14. That is, the through hole 145 extends through the dielectric layers (e.g., the first dielectric layer 141 and the second dielectric layer 142).

The upper redistribution layer 16 (i.e., the first redistribution layer) may be embedded in the upper dielectric structure 14 (i.e., the first dielectric structure) and may include a plurality of upper circuit layers (including, for example, a topmost upper circuit layer 161, a bottommost upper circuit layer 162 and at least one intermediate upper circuit layer 163). The upper circuit layers may be also referred to as "first circuit layers." In some embodiments, the upper circuit layers (e.g., the topmost upper circuit layer 161, the bottommost upper circuit layer 162 and the intermediate upper circuit layer 163) may be fan-out circuit layers (i.e., fine line width/line space circuit layers). That is, a line width/line space of the upper circuit layer (i.e., the first circuit layer) (e.g., the topmost upper circuit layer 161, the bottommost upper circuit layer 162 and the intermediate upper circuit layer 163) of the upper redistribution layer 16 may be less than about 10 μm/10 μm (e.g., less than or equal to 8 μm/8 μm, less than or equal to 5 μm/5 μm, less than or equal to 3 μm/3 μm, or less than or equal to 2 μm/2 μm).

The topmost upper circuit layer 161 may be disposed on a top surface of the second dielectric layer 142. The bottommost upper circuit layer 162 may be embedded in the first dielectric layer 141. The intermediate upper circuit layer 163 may be embedded in the second dielectric layer 142 and disposed between the topmost upper circuit layer 161 and the bottommost upper circuit layer 162. In some embodiments, a thickness of the topmost upper circuit layer 161, a thickness of the bottommost upper circuit layer 162 and a thickness of the intermediate upper circuit layer 163 may be the same. Further, the through hole 145 of the upper dielectric structure 14 may extend through the intermediate upper circuit layer 163 and the bottommost upper circuit layer 162.

The upper inner vias 17 may be disposed between the topmost upper circuit layer 161 and the intermediate upper circuit layer 163 for electrically connecting the topmost upper circuit layer 161 and the intermediate upper circuit layer 163. In some embodiments, the upper inner vias 17 may extend through the second dielectric layer 142 of the upper dielectric structure 14. In some embodiments, the second dielectric layer 142 may define a plurality of upper openings 143 extending through the second dielectric layer 142, and the upper inner vias 17 may be disposed in the upper openings 143. Further, the upper inner vias 17 and the topmost upper circuit layer 161 may be formed integrally. In some embodiments, the upper inner vias 17 may taper downward.

The upper protection layer 18 (e.g., solder mask) covers the second dielectric layer 142 of the upper dielectric structure 14 and the topmost upper circuit layer 161 of the upper redistribution layer 16. In some embodiments, the upper protection layer 18 may define a plurality of openings 182 to expose a portion of the topmost upper circuit layer 161 of the upper redistribution layer 16.

The upper connecting pads 19 may be disposed on a top surface of the upper protection layer 18 and extend into the openings 182 of the upper protection layer 18 to electrically connect or contact the exposed portion of the topmost upper circuit layer 161 of the upper redistribution layer 16.

The lower redistribution structure 20 may be also referred to as "a second high density redistribution structure". In some embodiments, the lower redistribution structure 20 (i.e., the second high density redistribution structure) and the upper redistribution structure 10 (i.e., the first high density redistribution structure) may be symmetric structure, for example, crossing symmetric structure.

The lower redistribution structure 20 (i.e., the second high density redistribution structure) has an upper surface 21, a lower surface 22 opposite to the upper surface 21 and a peripheral surface 23 extending between the upper surface 21 and the lower surface 22. In addition, the lower redistribution structure 20 (i.e., the second high density redistribution structure) may include a lower dielectric structure 24, a lower redistribution layer 26, a plurality of lower inner vias 27, a lower protection layer 28 and a plurality of lower connecting pads 29. The lower dielectric structure 24 may be also referred to as "a second dielectric structure," and the lower redistribution layer 26 may be also referred to as "a second redistribution layer."

The lower dielectric structure 24 (i.e., the second dielectric structure) may include at least one dielectric layer (including, for example, a first dielectric layer 241 and a second dielectric layer 242) and may define at least one through hole 245. In some embodiments, the lower dielectric structure 24 may include a plurality of dielectric layers (for example, a first dielectric layer 241 and a second dielectric layer 242). The dielectric layers (e.g., the first dielectric layer 241 and the second dielectric layer 242) are stacked to each other. For example, the second dielectric layer 242 is disposed on the first dielectric layer 241. In some embodiments, the dielectric layers (e.g., the first dielectric layer 241 and the second dielectric layer 242) may be made of a cured photoimageable dielectric material such as epoxy or polyimide (PI) including photoinitiators. That is, a material of the lower dielectric structure 24 (i.e., the second dielectric structure) may be cured photoimageable dielectric material. The through hole 245 extends through the lower dielectric structure 24. That is, the through hole 245 extends through the dielectric layers (e.g., the first dielectric layer 241 and the second dielectric layer 242).

The lower redistribution layer 26 (i.e., the second redistribution layer) may be embedded in the lower dielectric structure 24 (i.e., the second dielectric structure) and may include at least one lower circuit layer (including, for example, a topmost lower circuit layer 261, a bottommost lower circuit layer 262 and at least one intermediate lower circuit layer 263). The lower circuit layer may be also referred to as "a second circuit layer." In some embodiments, the lower circuit layer (e.g., the topmost lower circuit layer 261, the bottommost lower circuit layer 262 and the intermediate lower circuit layer 263) may be fan-out circuit layers (i.e., fine line width/line space circuit layers). That is, a line width/line space of the lower circuit layer (i.e., the second circuit layer) (e.g., the topmost lower circuit layer 261, the bottommost lower circuit layer 262 and the intermediate lower circuit layer 263) of the lower redistribution layer 26 may be less than about 10 μm/10 μm (e.g., less than or equal to 8 μm/8 μm, less than or equal to 5 m/5 μm, less than or equal to 3 μm/3 μm, or less than or equal to 2 μm/2 μm).

In some embodiments, the lower redistribution layer 26 may include a plurality of lower circuit layers (for example, a topmost lower circuit layer 261, a bottommost lower circuit layer 262 and at least one intermediate lower circuit layer 263). The topmost lower circuit layer 261 may be embedded in the first dielectric layer 241. The bottommost lower circuit layer 262 may be disposed on a bottom surface of the second dielectric layer 242. The intermediate lower circuit layer 263 may be embedded in the second dielectric layer 242 and disposed between the topmost lower circuit layer 261 and the bottommost lower circuit layer 262. In some embodiments, a thickness of the topmost lower circuit layer 261, a thickness of the bottommost lower circuit layer 262 and a thickness of the intermediate lower circuit layer 263 may be the same. Further, the through hole 245 of the lower dielectric structure 24 may extend through the intermediate lower circuit layer 263 and the topmost lower circuit layer 261.

In some embodiments, a metal content of the lower redistribution structure 20 may be substantially equal to a metal content of the upper redistribution structure 10 to reduce the warpage of the wiring structure 1. The metal content may be desiganated as a volume ratio of the metal in the redistribution structure. In some embodiments, a residual metal ratio (e.g., a residual copper ratio) is a ratio of the area of the metal (e.g., copper) to the entire area of the dielectric layer that the metal (e.g., copper) disposed on from a top view or a bottom view. For example, the residual metal ratio of the topmost lower circuit layer 261 of the lower redistribution layer 26 of the lower redistribution structure 20 may be substantially equal to the residual metal ratio of the bottommost upper circuit layer 162 of the upper redistribution layer 16 of the upper redistribution structure 10. The residual metal ratio of the intermediate lower circuit layer 263 of the lower redistribution layer 26 of the lower redistribution structure 20 may be substantially equal to the residual metal ratio of the intermediate upper circuit layer 163 of the upper redistribution layer 16 of the upper redistribution structure 10. The residual metal ratio of the bottommost lower circuit layer 262 of the lower redistribution layer 26 of the lower redistribution structure 20 may be substantially equal to the residual metal ratio of the topmost upper circuit layer 161 of the upper redistribution layer 16 of the upper redistribution structure 10.

The lower inner vias 27 may be disposed between the bottommost lower circuit layer 262 and the intermediate lower circuit layer 263 for electrically connecting the bottommost lower circuit layer 262 and the intermediate lower circuit layer 263. In some embodiments, the lower inner vias 27 may extend through the second dielectric layer 242 of the lower dielectric structure 24. In some embodiments, the second dielectric layer 242 may define a plurality of lower openings 243 extending through the second dielectric layer 242, and the lower inner vias 27 may be disposed in the lower openings 243. Further, the lower inner vias 27 and the bottommost lower circuit layer 262 may be formed integrally. In some embodiments, the lower inner vias 27 may taper upward.

The lower protection layer 28 (e.g., solder mask) covers the second dielectric layer 242 of the lower dielectric structure 24 and the bottommost lower circuit layer 262 of the lower redistribution layer 26. In some embodiments, the lower protection layer 28 may define a plurality of openings 282 to expose a portion of the bottommost lower circuit layer 262 of the lower redistribution layer 26.

The lower connecting pads 29 may be disposed on a bottom surface of the lower protection layer 28 and extend into the openings 282 of the lower protection layer 28 to electrically connect or contact the exposed portion of the bottommost lower circuit layer 262 of the lower redistribution layer 26.

The conductive structure 30 (i.e., the low density conductive structure) is disposed between and electrically connected to the upper redistribution structure 10 (i.e., the first high density redistribution structure) and the lower redistribution structure 20 (i.e., the second high density redistribution structure). The conductive structure 30 has a first surface (i.e., an upper surface) 31, a second surface (i.e., a lower surface) 32 opposite to the first surface 31 and a peripheral surface 33 extending between the first surface 31 and the second surface 32. In addition, the conductive structure 30 may include at least one dielectric layer (including, for example, a topmost dielectric layer 341, a bottommost dielectric layer 342 and at least one intermediate dielectric layer 343), at least one circuit layer (including, for example, a topmost circuit layer 361, a bottommost circuit layer 362 and at least one intermediate circuit layer 363) in contact with the dielectric layer (e.g., the topmost dielectric layer 341, the bottommost dielectric layer 342 and the intermediate dielectric layer 343) and at least one inner via 37. As shown in FIG. 1, the conductive structure 30 (i.e., the low density conductive structure) may be a coreless substrate.

In some embodiments, the conductive structure 30 may include a plurality of stacked dielectric layers (for example, a topmost dielectric layer 341, a bottommost dielectric layer 342 and at least one intermediate dielectric layer 343) and a plurality of circuit layers (for example, a topmost circuit layer 361, a bottommost circuit layer 362 and at least one intermediate circuit layer 363). The dielectric layers (e.g, the topmost dielectric layer 341, the bottommost dielectric layer 342 and the intermediate dielectric layer 343) are stacked to each other. For example, the topmost dielectric layer 341 is disposed on the intermediate dielectric layer 343, and the intermediate dielectric layer 343 is disposed on the bottommost dielectric layer 342. A material of each of the dielectric layers (e.g, the topmost dielectric layer 341, the bottommost dielectric layer 342 and the intermediate dielectric layer 343) may be non-photoimageable dielectric material such as polypropylene (PP) or ajinomoto build-up film (ABF). That is, the material (e.g., PI) of the upper dielectric structure 14 (including, for example, the first dielectric layer 141 and the second dielectric layer 142) of the upper redistribution structure 10 and the material (e.g., PI) of the lower dielectric structure 24 (including, for example, the first dielectric layer 241 and the second dielectric layer 242) of the lower redistribution structure 20 may be different from the material (e.g., PP) of each of the dielectric layers (including, for example, the topmost dielectric layer 341, the bottommost dielectric layer 342 and the intermediate dielectric layer 343) of the conductive structure 30. Further, a thickness of each of the dielectric layers (e.g., the first dielectric layer 141 and the second dielectric layer 142) of the upper dielectric structure 14 of the upper redistribution structure 10 (i.e., the first high density redistribution structure) and a thickness of each of the dielectric layers (e.g., the first dielectric layer 241 and the second dielectric layer 242) of the lower dielectric structure 24 of the lower redistribution structure 20 (i.e., the second high density redistribution structure) may be less than a thickness of each of the dielectric layers (e.g, the topmost dielectric layer 341, the bottommost dielectric layer 342 and the intermediate dielectric layer 343) of the conductive structure 30 (i.e., the low density conductive structure).

In some embodiments, the circuit layers (e.g., the topmost circuit layer 361, the bottommost circuit layer 362 and the intermediate circuit layer 363) may be coarse line width/line space circuit layers. That is, a line width/line space of the circuit layers (e.g., the topmost circuit layer 361, the bottommost circuit layer 362 and the intermediate circuit layer 363) may be greater than or equal to about 10 μm/10 μm, or greater than or equal to about 15 μm/15 μm. The topmost circuit layer 361 is disposed on a top surface of the topmost dielectric layer 341, and a bottom surface of the topmost circuit layer 361 may be substantially coplanar with the top surface of the topmost dielectric layer 341. The bottommost circuit layer 362 is disposed on a bottom surface of the bottommost dielectric layer 342, and a top surface of the bottommost circuit layer 362 may be substantially coplanar with the bottom surface of the bottommost dielectric layer 342. The intermediate circuit layer 363 is disposed between the topmost circuit layer 361 and the bottommost circuit layer 362, and in contact with the intermediate dielectric layer 343.

In some embodiments, a thickness of the upper circuit layer (i.e., the first circuit layer) (e.g., the topmost upper circuit layer 161, the bottommost upper circuit layer 162 and the intermediate upper circuit layer 163) of the upper redistribution layer 16 (i.e., the first redistribution layer) of the upper redistribution structure 10 (i.e., the first high density redistribution structure) and a thickness of the lower circuit layer (i.e., the second circuit layer) (e.g., the topmost lower circuit layer 261, the bottommost lower circuit layer 262 and the intermediate lower circuit layer 263) of the lower redistribution layer 26 (i.e., the second redistribution layer) of the lower redistribution structure 20 (i.e., the second high density redistribution structure) may be less than a thickness of the circuit layer (e.g., the topmost circuit layer 361, the bottommost circuit layer 362 and the intermediate circuit layer 363) of the conductive structure 30 (i.e., the low density conductive structure). Further, the line width/line space of the upper circuit layer (i.e., the first circuit layer) (e.g., the topmost upper circuit layer 161, the bottommost upper circuit layer 162 and the intermediate upper circuit layer 163) of the upper redistribution layer 16 (i.e., the first redistribution layer) of the upper redistribution structure 10 (i.e., the first high density redistribution structure) and the line width/line space of the lower circuit layer (i.e., the second circuit layer) (e.g., the topmost lower circuit layer 261, the bottommost lower circuit layer 262 and the intermediate lower circuit layer 263) of the lower redistribution layer 26 (i.e., the second redistribution layer) of the lower redistribution structure 20 (i.e., the second high density redistribution structure) may be less than the line width/line space of the circuit layer (e.g., the topmost circuit layer 361, the bottommost circuit layer 362 and the intermediate circuit layer 363) of the conductive structure 30 (i.e., the low density conductive structure).

The conductive structure 30 may include a plurality of inner vias 37. The inner vias 37 extend through the dielectric layers (e.g, the topmost dielectric layer 341, the bottommost dielectric layer 342 and the intermediate dielectric layer 343) and are disposed between the circuit layers (e.g., the topmost circuit layer 361, the bottommost circuit layer 362 and the intermediate circuit layer 363) for electrically connecting the circuit layers (e.g., the topmost circuit layer 361, the bottommost circuit layer 362 and the intermediate circuit layer 363). In some embodiments, the inner via 37 may taper upward. That is, a size (e.g., width) of a top portion of the inner via 37 is less than a size (e.g., width) of a bottom portion of the inner via 37.

The upper bonding layer 41 is disposed between the upper redistribution structure 10 (i.e., the first high density redistribution structure) and the conductive structure 30 (i.e., the low density conductive structure) to bond the upper redistribution structure 10 (i.e., the first high density redistribution structure) and the conductive structure 30 (i.e., the low density conductive structure) together. That is, the upper redistribution structure 10 (i.e., the first high density redistribution structure) is attached to the first surface 31 of the conductive structure 30 (i.e., the low density conductive structure) through the upper bonding layer 41. A material of the upper bonding layer 41 may be transparent. In some embodiments, the upper bonding layer 41 may have a top surface 411, a bottom surface 412 opposite to the top surface 411 and a peripheral surface 413. The top surface 411 may contact the lower surface 12 of the upper redistribution structure 10. The bottom surface 412 may contact the first surface 31 of the conductive structure 30. The peripheral surface 413 extends between the top surface 411 and the bottom surface 412. In some embodiments, the peripheral surface 413 of the upper bonding layer 41 may be substantially coplanar with the peripheral surface 13 of the upper redistribution structure 10 and the peripheral surface 33 of the conductive structure 30. Further, the upper bonding layer 41 may cover the topmost circuit layer 361 of the conductive structure 30.

In some embodiments, the upper bonding layer 41 may define at least one through hole 415 extending through the upper bonding layer 41. As shown in FIG. 1, the through hole 415 of the upper bonding layer 41 may be aligned with and in communication with the through hole 145 of the upper dielectric structure 14 of the upper redistribution structure 10. Thus, the through hole 145 of the upper dielectric structure 14 of the upper redistribution structure 10 and the through hole 415 of the upper bonding layer 41 may constitute at least one upper through hole 71.

The upper conductive via 51 is formed or disposed in the upper through hole 71 (including, for example, the through hole 145 of the upper dielectric structure 14 of the upper redistribution structure 10 and the through hole 415 of the upper bonding layer 41). Thus, the upper conductive via 51 extends through at least a portion (e.g., the upper dielectric structure 14 and the intermediate upper circuit layer 163 and the bottommost upper circuit layer 162 of the upper redistribution layer 16) of the upper redistribution structure 10 and the upper bonding layer 41, and is electrically connected to the upper redistribution layer 16 (e.g., the topmost upper circuit layer 161, the bottommost upper circuit layer 162 and the intermediate upper circuit layer 163) of the upper redistribution structure 10 and the topmost circuit layer 361 of the conductive structure 30. That is, the upper redistribution structure 10 (i.e., the first high density redistribution structure) is electrically connected to the first surface 31 of the conductive structure 30 (i.e., the low density conductive structure) through the upper conductive via 51 and the topmost circuit layer 361. In some embodiments, a tapering direction of the upper conductive via 51 may be the same as a tapering direction of the upper inner via 17 of the upper redistribution structure 10. As shown in FIG. 1, the upper conductive via 51 may taper downward. In some embodiments, the upper conductive via 51 may be a monolithic structure or a bulk structure, and a peripheral surface of the upper conductive via 51 may be a substantially continuous plane. The upper conductive via 51 and the topmost upper circuit layer 161 of the upper redistribution layer 16 of the upper redistribution structure 10 may be formed integrally.

The lower bonding layer 42 is disposed between the lower redistribution structure 20 (i.e., the second high density redistribution structure) and the conductive structure 30 (i.e., the low density conductive structure) to bond the lower redistribution structure 20 (i.e., the second high density redistribution structure) and the conductive structure 30 (i.e., the low density conductive structure) together. That is, the lower redistribution structure 20 (i.e., the second high density redistribution structure) is attached to the second surface 32 of the conductive structure 30 (i.e., the low density conductive structure) through the lower bonding layer 42. A material of the lower bonding layer 42 may be transparent. In some embodiments, the lower bonding layer 42 may have a top surface 421, a bottom surface 422 opposite to the top surface 421 and a peripheral surface 423. The top surface 421 may contact the second surface 32 of the conductive structure 30. The bottom surface 422 may contact the upper surface 21 of the lower redistribution structure 20. The peripheral surface 423 extends between the top surface 421 and the bottom surface 422. In some embodiments, the peripheral surface 423 of the lower bonding layer 42 may be substantially coplanar with the peripheral surface 23 of the lower redistribution structure 20 and the peripheral surface 33 of the conductive structure 30. Further, the lower bonding layer 42 may cover the bottommost circuit layer 362 of the conductive structure 30.

In some embodiments, the lower bonding layer 42 may define at least one through hole 425 extending through the lower bonding layer 42. As shown in FIG. 1, the through hole 425 of the lower bonding layer 42 may be aligned with and in communication with the through e eths 2 hole 245 of the lower dielectric structure 24 of the lower redistribution structure 20. That is, the through hole 245 of the lower dielectric structure 24 of the lower redistribution structure 20 and the through hole 425 of the lower bonding layer 42 may constitute at least one lower through hole 72.

The lower conductive via 52 is formed or disposed in the lower through hole 72 (including, for example, the through hole 245 of the lower dielectric structure 24 of the lower redistribution structure 20 and the through hole 425 of the lower bonding layer 42). Thus, the lower conductive via 52 extends through at least a portion (e.g., the lower dielectric structure 24 and the intermediate lower circuit layer 263 and the topmost lower circuit layer 261 of the lower redistribution layer 26) of the lower redistribution structure 20 and the lower bonding layer 42, and is electrically connected to the lower redistribution layer 26 (e.g., the topmost lower circuit layer 261, the bottommost lower circuit layer 262 and the intermediate lower circuit layer 263) of the lower redistribution structure 20 and the bottommost circuit layer 362 of the conductive structure 30. That is, the lower redistribution structure 20 (i.e., the second high density redistribution structure) is electrically connected to the second surface 32 of the conductive structure 30 (i.e., the low density conductive structure) through the lower conductive via 52 and the bottommost circuit layer 362. In some embodiments, a tapering direction of the lower conductive via 52 may be the same as a tapering direction of the lower inner via 27 of the lower redistribution structure 20. As shown in FIG. 1, the lower conductive via 52 may taper upward. In some embodiments, the lower conductive via 52 may be a monolithic structure or a bulk structure, and a peripheral surface of the lower conductive via 52 may be a substantially continuous plane. The lower conductive via 52 and the bottommost lower circuit layer 262 of the lower redistribution layer 26 of the lower redistribution structure 20 may be formed integrally.

As shown in the embodiment illustrated in FIG. 1, the wiring structure 1 is a combination of the upper redistribution structure 10 (i.e., the first high density redistribution structure), the lower redistribution structure 20 (i.e., the second high density redistribution structure) and the conductive structure 30 (i.e., the low density conductive structure), in which the upper redistribution structure 10 (i.e., the first high density redistribution structure) and the lower redistribution structure 20 (i.e., the second high density redistribution structure) are symmetric structure (for example, crossing symmetric structure). As a result, the warpage of the wiring structure 1 may be significantly reduced during thermal processing. In addition, a thickness of the wiring structure 1 may be reduced, and a yield of the wiring structure 1 may be improved.

Figure 2:
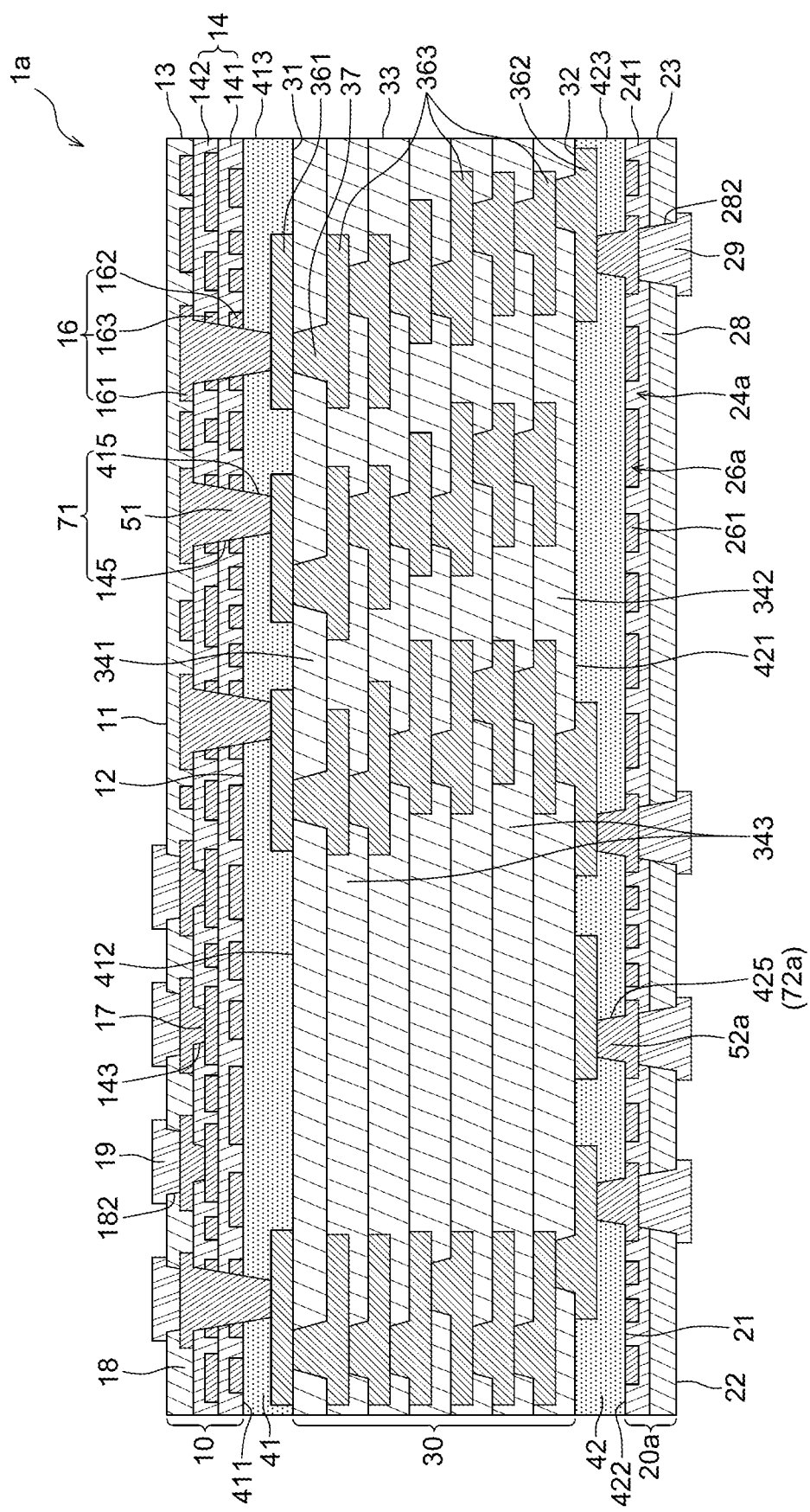
FIG. 2 illustrates a cross-sectional view of a wiring structure according to some embodiments of the present disclosure.

FIG. 2 illustrates a cross-sectional view of a wiring structure 1a according to some embodiments of the present disclosure. The wiring structure 1a is similar to the wiring structure 1 shown in FIG. 1, except for the structure of the lower redistribution structure 20a (i.e., the second high density redistribution structure). As shown in FIG. 2, a number of the dielectric layers of the lower dielectric structure 24a (i.e., the second dielectric structure) of the lower redistribution structure 20a (i.e., the second high density redistribution structure) is reduced from 2 (e.g., the first dielectric layer 241 and the second dielectric layer 242 of FIG. 1) to 1 (e.g., the first dielectric layer 241 of FIG. 2), and a number of the lower circuit layers of the lower redistribution layer 26 (i.e., the second redistribution layer) of the lower redistribution structure 20a (i.e., the second high density redistribution structure) is reduced from 3 (e.g., the topmost lower circuit layer 261, the bottommost lower circuit layer 262 and the intermediate lower circuit layer 263 of FIG. 1) to 1 (e.g., the topmost lower circuit layer 261 of FIG. 2). That is, a number of the at least one dielectric layer (e.g., the first dielectric layer 241) of the lower dielectric structure 24a (i.e., the second dielectric structure) of the lower redistribution structure 20a (i.e., the second high density redistribution structure) is different from a number of the dielectric layers (e.g., the first dielectric layer 141 and the second dielectric layer 142) of the upper dielectric structure 14 (i.e., the first dielectric structure) of the upper redistribution structure 10 (i.e., the first high density redistribution structure), and a number of the at least one lower circuit layer 261 (i.e., the second circuit layer) of the lower redistribution layer 26a (i.e., the second redistribution layer) of the lower redistribution structure 20a (i.e., the second high density redistribution structure) is different from a number of the upper circuit layers (i.e., the first circuit layers) (e.g., the topmost upper circuit layer 161, the bottommost upper circuit layer 162 and the intermediate upper circuit layer 163) of the upper redistribution layer 16 (i.e., the first redistribution layer) of the upper redistribution structure 10 (i.e., the first high density redistribution structure). In some embodiments, the lower through hole 72a may only include the through hole 425 of the lower bonding layer 42. That is, the lower conductive via 52a may be formed or disposed in the through hole 425 (i.e., the lower through hole 72a) of the lower bonding layer 42 only.

To compensate the mismatch issues of coefficient of thermal expansion (CTE) existed between the dielectric layers (e.g., the first dielectric layer 141 and the second dielectric layer 142 of the upper dielectric structure 14 and the first dielectric layer 241 of the lower dielectric structure 24a) and the circuit layers (e.g., the topmost upper circuit layer 161, the bottommost upper circuit layer 162 and the intermediate upper circuit layer 163 of the upper redistribution layer 16 and the lower circuit layer 261 of the lower redistribution layer 26a), a ratio of a total thickness (i.e., a sum of a thickness of the first dielectric layer 141 and a thickness of the second dielectric layer 142) of the upper dielectric structure 14 (i.e., the first dielectric structure) to a total thickness (i.e., a thickness of the first dielectric layer 241) of the lower dielectric structure 24a (i.e., the second dielectric structure) may be 0.58 to 3, and a ratio of a total thickness (i.e., a sum of a thickness of the topmost upper circuit layer 161, a thickness of the bottommost upper circuit layer 162 and a thickness of the intermediate upper circuit layer 163) of the upper redistribution layer 16 (i.e., the first redistribution layer) to a total thickness (i.e., a thickness of the lower circuit layer 261) of the lower redistribution layer 26a (i.e., the second redistribution layer) may be 0.3 to 3. As a result, the warpage of the wiring structure 1a may be significantly reduced during thermal processing.

Figure 3:
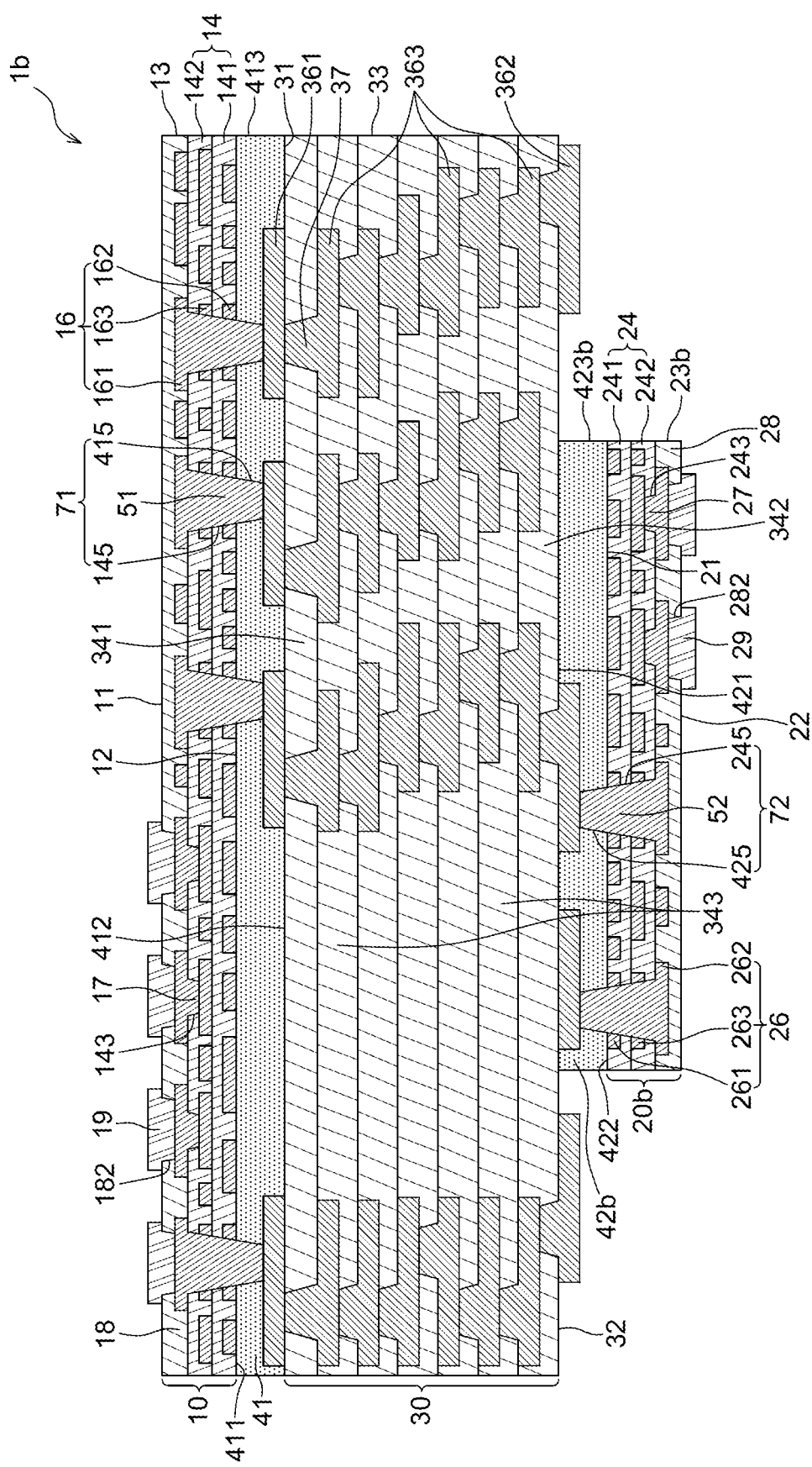
FIG. 3 illustrates a cross-sectional view of a wiring structure according to some embodiments of the present disclosure.

FIG. 3 illustrates a cross-sectional view of a wiring structure 1b according to some embodiments of the present disclosure. The wiring structure 1b is similar to the wiring structure 1 shown in FIG. 1, except for sizes of the lower redistribution structure 20b and the lower bonding layer 42b. In some embodiments, as shown in FIG. 3, from a top view or a bottom view, a size of the lower redistribution structure 20b and a size of the lower bonding layer 42b may be different from a size of the conductive structure 30 and a size of the upper redistribution structure 10. For example, from a top view or a bottom view, the size of the lower redistribution structure 20b and the size of the lower bonding layer 42b may be less than the size of the conductive structure 30 and the size of the upper redistribution structure 10. That is, a peripheral surface 23b of the lower redistribution structure 20b and a peripheral surface 423b of the lower bonding layer 42b may be non-coplanar with the peripheral surface 33 of the conductive structure 30 and the peripheral surface 13 of the upper redistribution structure 10. In some embodiments, from a top view or a bottom view, the size of the lower redistribution structure 20b and the size of the lower bonding layer 42b may be the same. Thus, the peripheral surface 23b of the lower redistribution structure 20b may be substantially coplanar with the peripheral surface 423b of the lower bonding layer 42b. In addition, from a top view or a bottom view, the size of the lower bonding layer 42b may be less than a size of the upper bonding layer 41. That is, the peripheral surface 423b of the lower bonding layer 42b may be non-coplanar with a peripheral surface 413 of the upper bonding layer 41.

Figure 4:
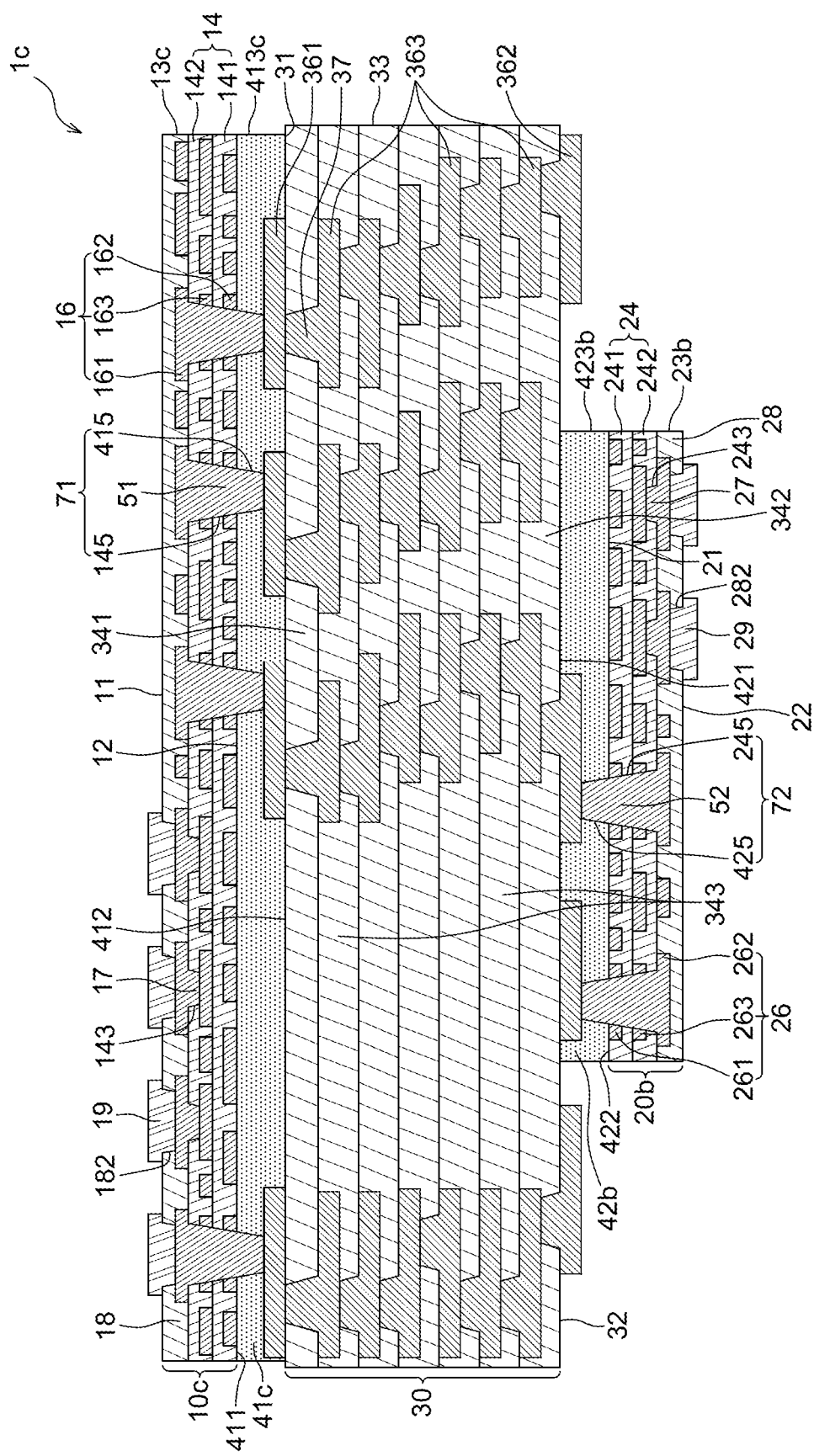
FIG. 4 illustrates a cross-sectional view of a wiring structure according to some embodiments of the present disclosure.

FIG. 4 illustrates a cross-sectional view of a wiring structure 1c according to some embodiments of the present disclosure. The wiring structure 1c is similar to the wiring structure 1b shown in FIG. 3, except for sizes of the upper redistribution structure 10c and the upper bonding layer 41c. In some embodiments, as shown in FIG. 4, from a top view or a bottom view, a size of the upper redistribution structure 10c and a size of the upper bonding layer 41c may be different from a size of the conductive structure 30. For example, from a top view or a bottom view, the size of the upper redistribution structure 10c and the size of the upper bonding layer 41c may be less than the size of the conductive structure 30. That is, a peripheral surface 13c of the upper redistribution structure 10c and a peripheral surface 413c of the upper bonding layer 41c may be non-coplanar with the peripheral surface 33 of the conductive structure 30. In some embodiments, from a top view or a bottom view, the size of the upper redistribution structure 10c and the size of the upper bonding layer 41c may be the same. Thus, the peripheral surface 13c of the upper redistribution structure 10c may be substantially coplanar with the peripheral surface 413c of the upper bonding layer 41c.

Figure 5:
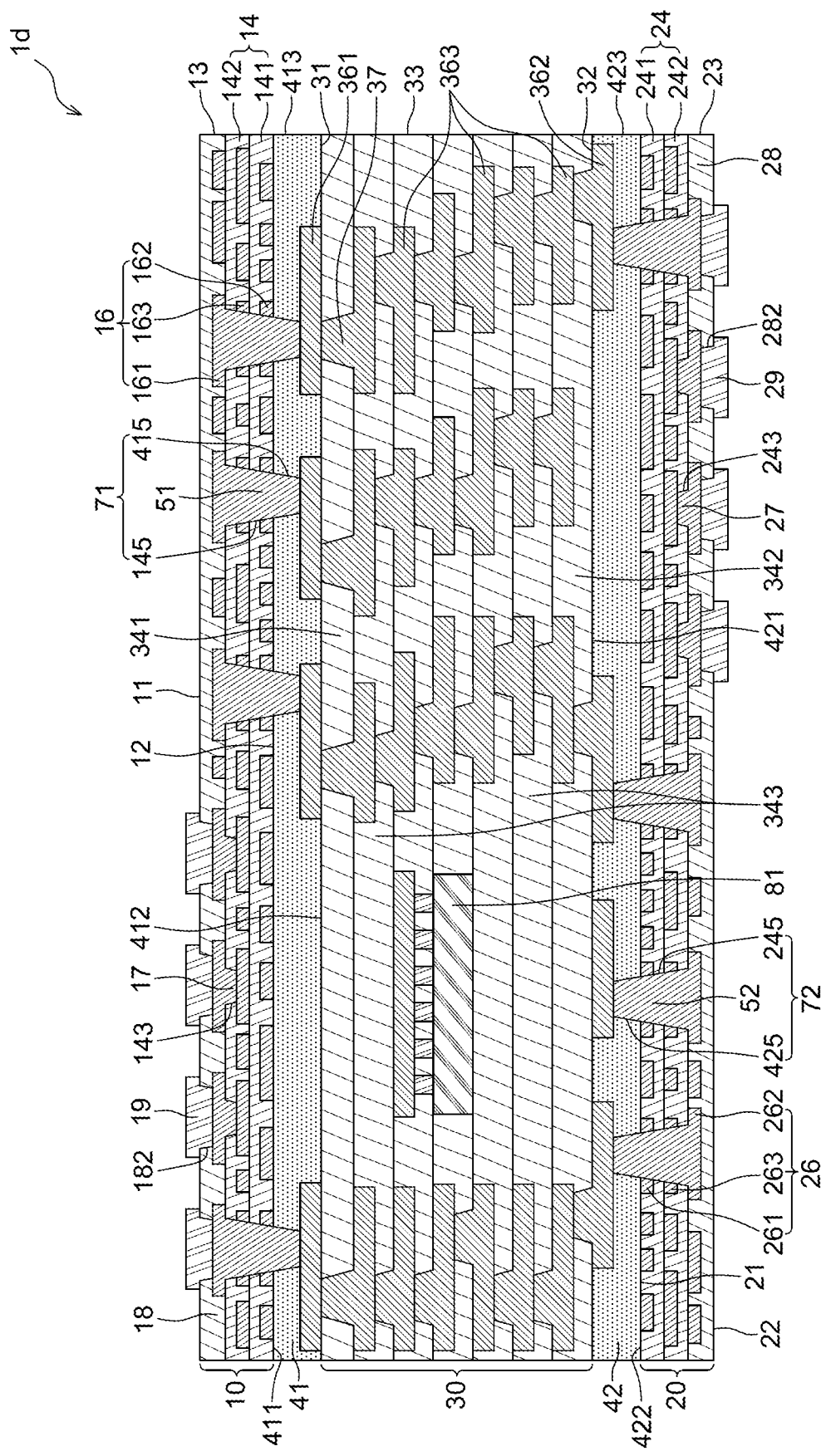
FIG. 5 illustrates a cross-sectional view of a wiring structure according to some embodiments of the present disclosure.

FIG. 5 illustrates a cross-sectional view of a wiring structure 1d according to some embodiments of the present disclosure. The wiring structure 1d is similar to the wiring structure 1 shown in FIG. 1, except that the wiring structure 1d further includes at least one semiconductor device 81. The semiconductor device 81 may be, for example, a semiconductor die or a semiconductor chip. The semiconductor device 81 is embedded in the conductive structure 30. Further, the semiconductor device 81 is electrically connected to at least one circuit layer (e.g., the intermediate circuit layer 363) of the conductive structure 30.

Figure 6:
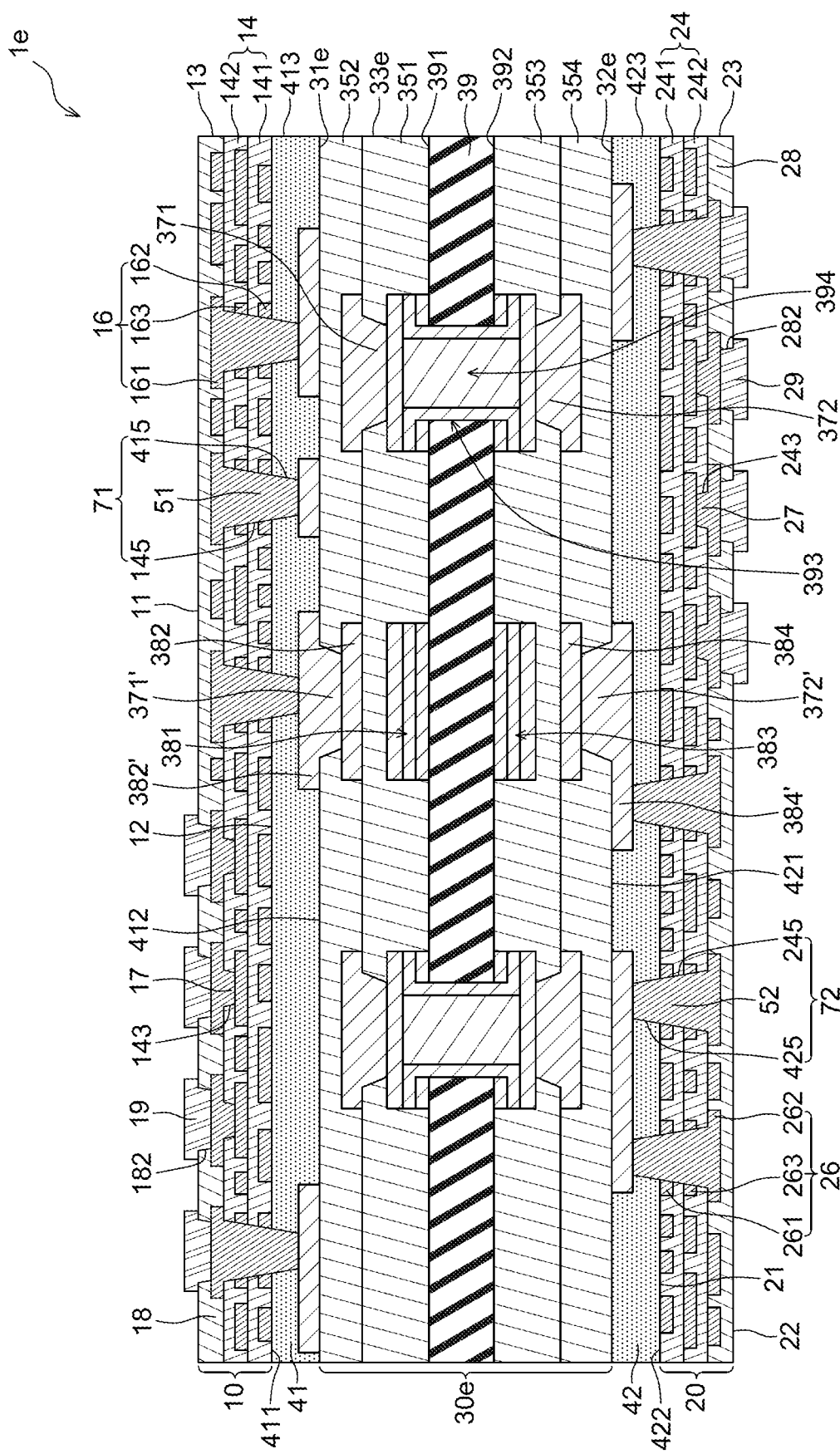
FIG. 6 illustrates a cross-sectional view of a wiring structure according to some embodiments of the present disclosure.

FIG. 6 illustrates a cross-sectional view of a wiring structure 1e according to some embodiments of the present disclosure. The wiring structure 1e is similar to the wiring structure 1 shown in FIG. 1, except for the structure of the conductive structure 30e. In some embodiments, as shown in FIG. 6, the conductive structure 30e may be a core substrate that further includes a core portion 39. The conductive structure 30e has a first surface (i.e., an upper surface) 31e, a second surface (i.e., a lower surface) 32e opposite to the first surface 31e and a peripheral surface 33e extending between the first surface 31e and the second surface 32e. The conductive structure 30e may include a plurality of dielectric layers (for example, one first upper dielectric layer 351, one second upper dielectric layer 352, one first lower dielectric layer 353 and one second lower dielectric layer 354), a plurality of circuit layers (for example, one first upper circuit layer 381, two second upper circuit layers 382, 382', one first lower circuit layer 383 and two second lower circuit layers 384, 384') and at least one inner via (including, for example, a plurality of upper vias 371, 371' and a plurality of lower vias 372, 372').

The core portion 39 may be in a wafer type, a panel type or a strip type. The core portion 39 has a top surface 391 and a bottom surface 392 opposite to the top surface 391, and defines a plurality of through holes 393 extending through the core portion 39. An interconnection via 394 is disposed or formed in the through hole 393 for vertical connection.

The first upper dielectric layer 351 is disposed on the top surface 391 of the core portion 39. The second upper dielectric layer 352 is stacked or disposed on a top surface of the first upper dielectric layer 351. The first lower dielectric layer 353 is disposed on the bottom surface 392 of the core portion 39. The second lower dielectric layer 354 is stacked or disposed on a bottom surface of the first lower dielectric layer 353. The first upper circuit layer 381 is embedded in the first upper dielectric layer 351. The second upper circuit layer 382 is embedded in the second upper dielectric layer 352 and electrically connected to the first upper circuit layer 381 through the upper via 371. The second upper circuit layer 382' is disposed on a top surface of the second upper dielectric layer 352 and electrically connected to the second upper circuit layer 382 through the upper via 371'. The first lower circuit layer 383 is embedded in the first lower dielectric layer 353. The second lower circuit layer 384 is embedded in the second lower dielectric layer 354 and electrically connected to the first lower circuit layer 383 through the lower via 372. The second lower circuit layer 384' is disposed on a bottom surface of the second lower dielectric layer 354 and electrically connected to the second lower circuit layer 384 through the lower via 372'.

The upper conductive via 51 is electrically connected to the upper redistribution layer 16 of the upper redistribution structure 10 and the second upper circuit layer 382' of the conductive structure 30e. The lower conductive via 52 is electrically connected to the lower redistribution layer 26 of the lower redistribution structure 20 and the second lower circuit layer 384' of the conductive structure 30e.

Figure 7:
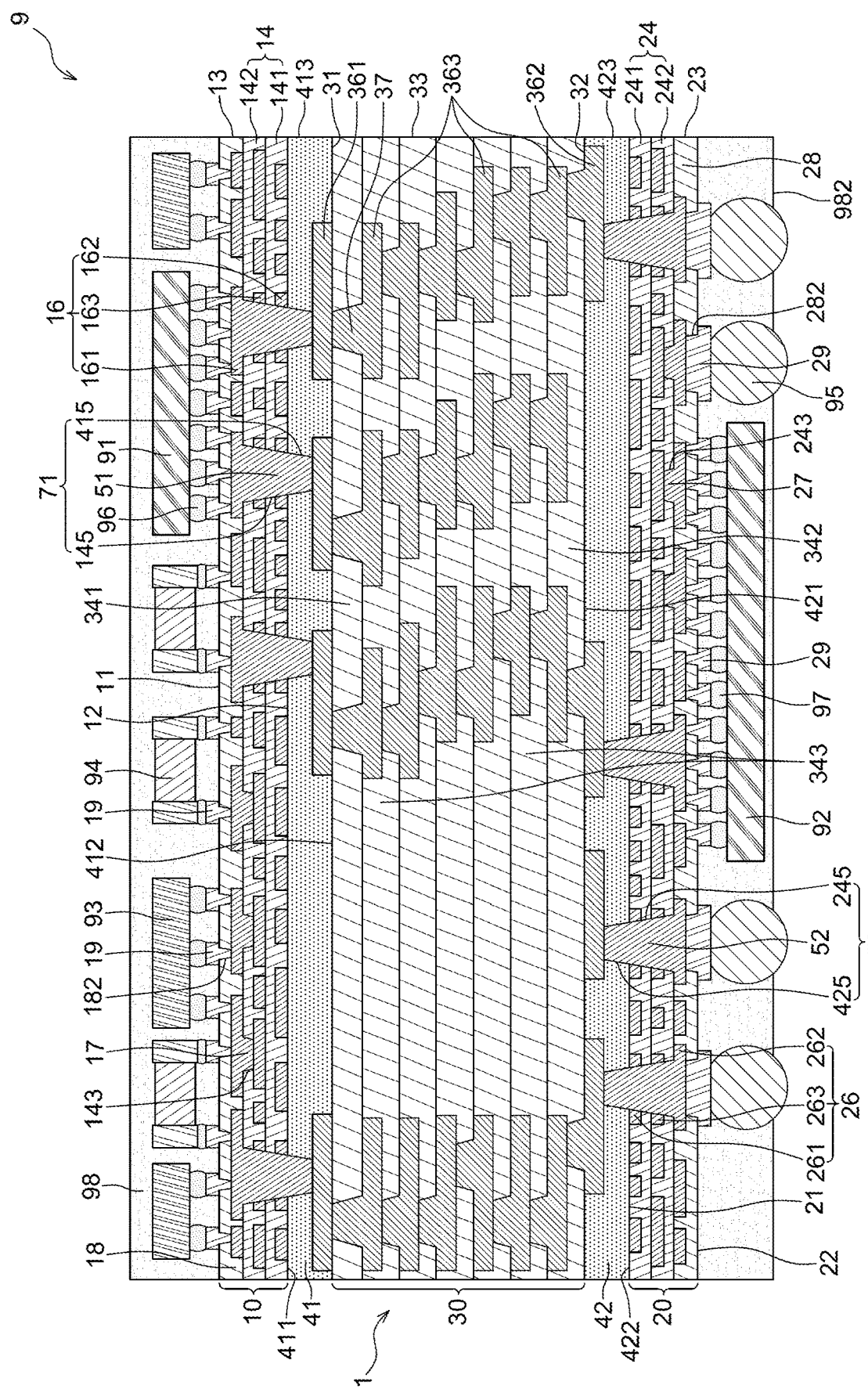
FIG. 7 illustrates a cross-sectional view of a package structure according to some embodiments of the present disclosure.

FIG. 7 illustrates a cross-sectional view of a package structure 9 according to some embodiments of the present disclosure. The package structure 9 includes a wiring structure 1, at least one first semiconductor device 91, at least one second semiconductor device 92, at least one first electronic component 93, at least one second electronic component 94, a plurality of external connectors 95, a plurality of first connecting elements 96, a plurality of second connecting elements 97 and at least one encapsulant 98. The wiring structure 1 of FIG. 7 may be similar to the wiring structure 1 shown in FIG. 1. The first semiconductor device 91 may be, for example, a semiconductor die or a semiconductor chip. The first semiconductor device 91 is electrically connected and bonded to some of the upper connecting pads 19 of the upper redistribution structure 10 through the first connecting elements 96 (e.g., solders or bumps). The second semiconductor device 92 may be, for example, a semiconductor die or a semiconductor chip. The second semiconductor device 92 is electrically connected and bonded to some of the lower connecting pads 29 of the lower redistribution structure 20 through the second connecting elements 97 (e.g., solders or bumps). The first electronic component 93 may be, for example, a low-noise amplifier, a switch, or a filter. The first electronic component 93 is electrically connected and bonded to some of the upper connecting pads 19 of the upper redistribution structure 10 through solders or bumps. The second electronic component 94 may be a passive component, for example, a resistor, a capacitor, or an inductor. The second electronic component 94 is electrically connected and bonded to some of the upper connecting pads 19 of the upper redistribution structure 10 through solders or bumps. The external connectors 95 (e.g., solders or bumps) are bonded to some of the lower connecting pads 29 of the lower redistribution structure 20 for external connection. The encapsulant 98 (e.g., molding compound with or without fillers) is formed or disposed on the upper surface 11 of the upper redistribution structure 10 and the lower surface 22 of the lower redistribution structure 20 to cover the first semiconductor device 91, the second semiconductor device 92, the first electronic component 93, the second electronic component 94, the external connectors 95, the first connecting elements 96 and the second connecting elements 97. In some embodiments, a portion of each of the external connectors 95 may protrude downward from a bottom surface 982 of the encapsulant 98.

FIG. 8 through FIG. 14 illustrate a method for manufacturing a wiring structure according to some embodiments of the present disclosure. In some embodiments, the method is for manufacturing a wiring structure such as the wiring structure 1 shown in FIG. 1.

Figure 8:
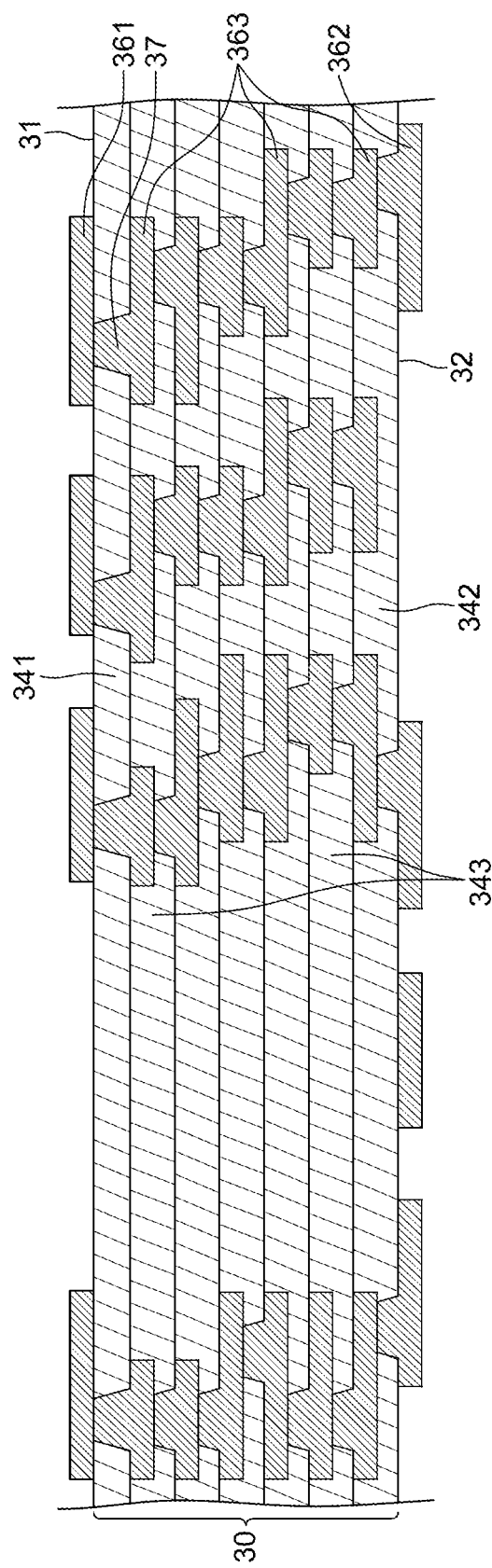
FIG. 8 illustrates one or more stages of an example of a method for manufacturing a wiring structure according to some embodiments of the present disclosure.

Referring to FIG. 8, a conductive structure 30 is provided. The conductive structure 30 has a first surface (i.e., an upper surface) 31, a second surface (i.e., a lower surface) 32 opposite to the first surface 31 and a peripheral surface 33 extending between the first surface 31 and the second surface 32. In addition, the conductive structure 30 may include at least one dielectric layer (including, for example, a topmost dielectric layer 341, a bottommost dielectric layer 342 and at least one intermediate dielectric layer 343), at least one circuit layer (including, for example, a topmost circuit layer 361, a bottommost circuit layer 362 and at least one intermediate circuit layer 363) in contact with the dielectric layer (e.g., the topmost dielectric layer 341, the bottommost dielectric layer 342 and the intermediate dielectric layer 343) and at least one inner via 37. As shown in FIG. 8, the conductive structure 30 may be a coreless substrate that is similar to the conductive structure 30 of FIG. 1.

Figure 9:
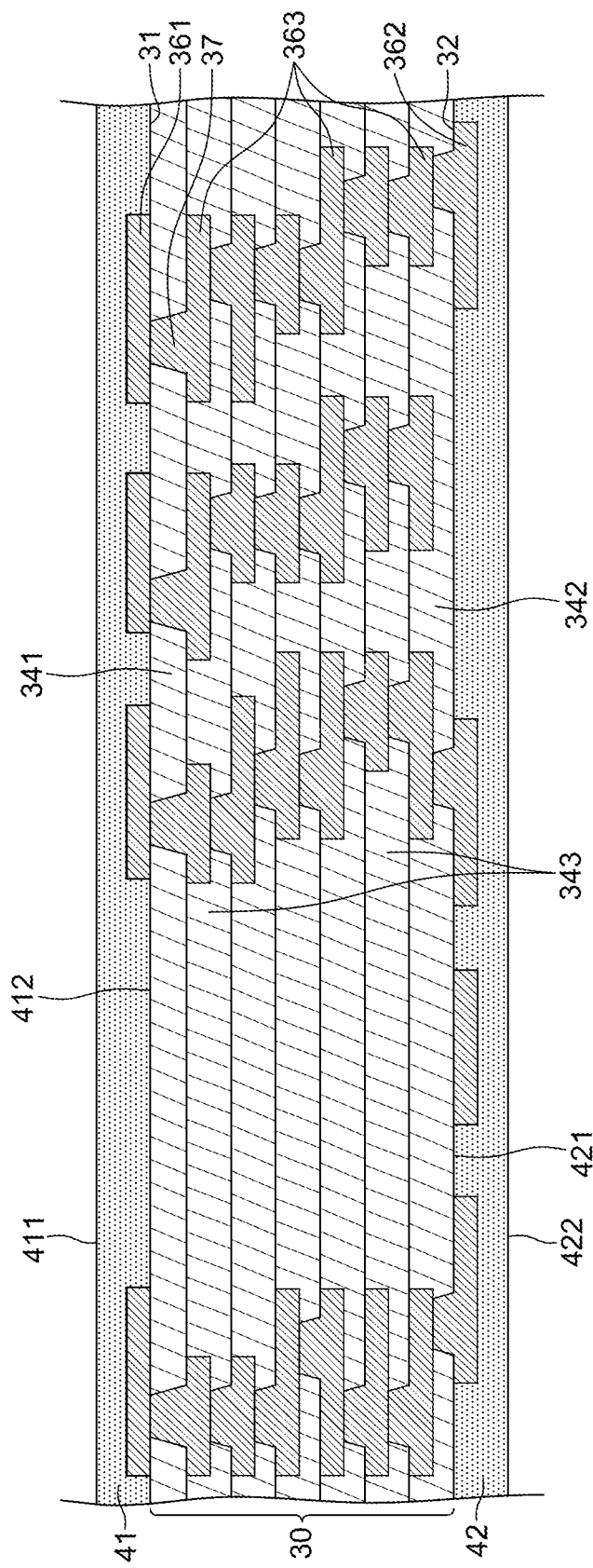
FIG. 9 illustrates one or more stages of an example of a method for manufacturing a wiring structure according to some embodiments of the present disclosure.

Referring to FIG. 9, an upper bonding layer 41 is formed or disposed on the first surface 31 of the conductive structure 30, and a lower bonding layer 42 is formed or disposed on the second surface 32 of the conductive structure 30. The upper bonding layer 41 may cover the topmost circuit layer 361 of the conductive structure 30, and the lower bonding layer 42 may cover the bottommost circuit layer 362 of the conductive structure 30. A material of the upper bonding layer 41 and a material of the lower bonding layer 42 may be transparent.

Figure 10:
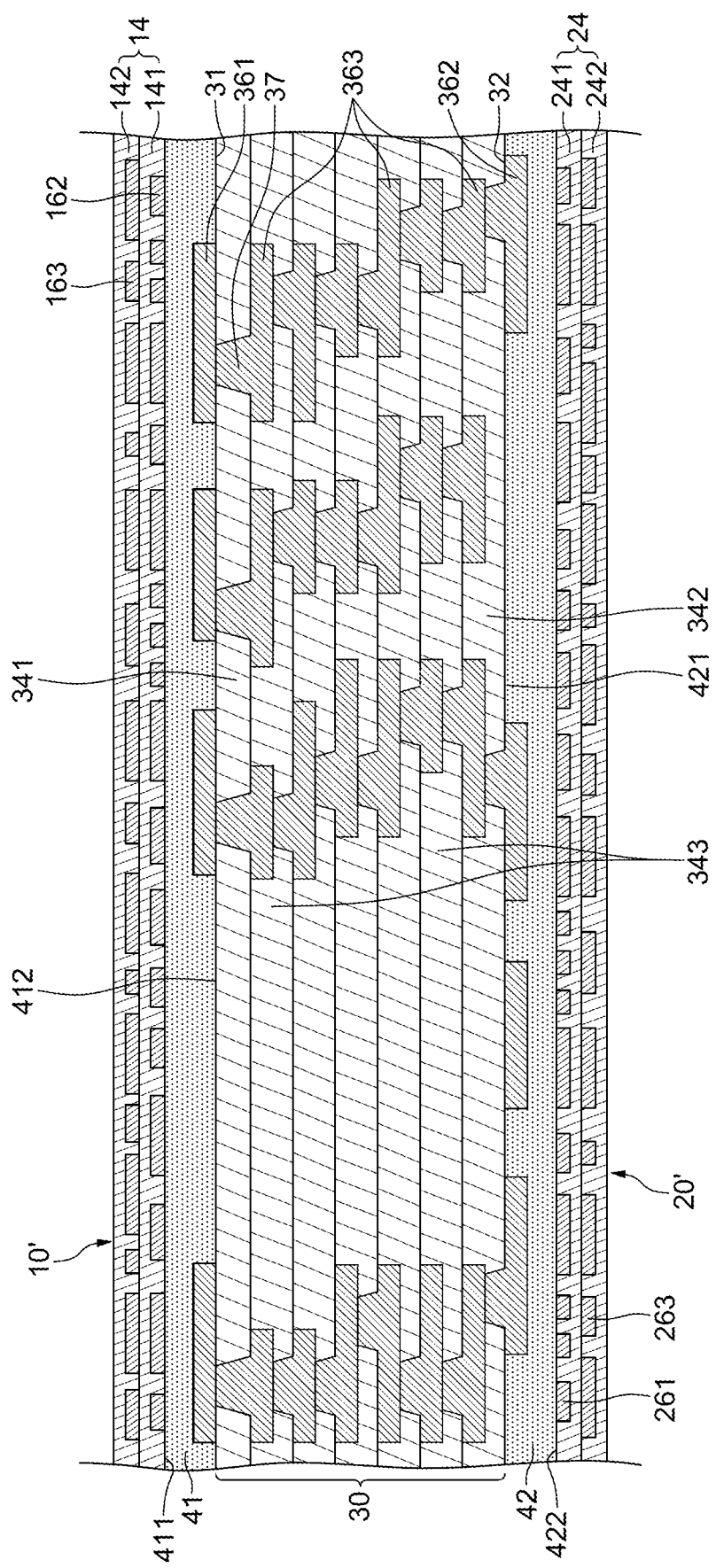
FIG. 10 illustrates one or more stages of an example of a method for manufacturing a wiring structure according to some embodiments of the present disclosure.

Referring to FIG. 10, an upper conductive structure 10' is attached to a top surface 411 of the upper bonding layer 41, and a lower conductive structure 20' is attached to a bottom surface 422 of the lower bonding layer 42.

The upper conductive structure 10' includes a bottommost upper circuit layer 162, a first dielectric layer 141, at least one intermediate upper circuit layer 163 and a second dielectric layer 142. The bottommost upper circuit layer 162 is attached to the top surface 411 of the upper bonding layer 41 and embedded in the first dielectric layer 141. The bottommost upper circuit layer 162 may be a fan-out circuit layer (i.e., a fine line width/line space circuit layer). That is, a line width/line space of the bottommost upper circuit layer 162 may be less than about 10 µm/10 µm (e.g., less than or equal to 8 µm/8 µm, less than or equal to 5 µm/5 µm, less than or equal to 3 µm/3 µm, or less than or equal to 2 µm/2 µm). The first dielectric layer 141 is attached to the top surface 411 of the upper bonding layer 41. The first dielectric layer 141 may be made of a cured photoimageable dielectric material such as epoxy or polyimide (PI) including photoinitiators. The intermediate upper circuit layer 163 is formed on a top surface of the first dielectric layer 141. The intermediate upper circuit layer 163 may be a fan-out circuit layer (i.e., a fine line width/line space circuit layer). That is, a line width/line space of the intermediate upper circuit layer 163 may be less than about 10 µm/10 µm (e.g., less than or equal to 8 µm/8 µm, less than or equal to 5 µm/5 µm, less than or equal to 3 µm/3 µm, or less than or equal to 2 µm/2 µm). The second dielectric layer 142 is formed on the top surface of the first dielectric layer 141 to cover the intermediate upper circuit layer 163. The second dielectric layer 142 may be made of a cured photoimageable dielectric material such as epoxy or polyimide (PI) including photoinitiators. In some embodiments, the first dielectric layer 141 and the second dielectric layer 142 may constitute an upper dielectric structure 14.

The lower conductive structure 20' includes a topmost lower circuit layer 261, a first dielectric layer 241, at least one intermediate lower circuit layer 263 and a second dielectric layer 242. The topmost lower circuit layer 261 is attached to the bottom surface 422 of the lower bonding layer 42 and embedded in the first dielectric layer 241. The topmost lower circuit layer 261 may be a fan-out circuit layer (i.e., a fine line width/line space circuit layer). That is, a line width/line space of the topmost lower circuit layer 261 may be less than about 10 µm/10 µm (e.g., less than or equal to 8 µm/8 µm, less than or equal to 5 µm/5 µm, less than or equal to 3 µm/3 µm, or less than or equal to 2 µm/2 µm). The first dielectric layer 241 is attached to the bottom surface 422 of the lower bonding layer 42. The first dielectric layer 241 may be made of a cured photoimageable dielectric material such as epoxy or polyimide (PI) including photoinitiators. The intermediate lower circuit layer 263 is formed on a bottom surface of the first dielectric layer 241. The intermediate lower circuit layer 263 may be a fan-out circuit layer (i.e., a fine line width/line space circuit layer). That is, a line width/line space of the intermediate lower circuit layer 263 may be less than about 10 µm/10 µm (e.g., less than or equal to 8 µm/8 µm, less than or equal to 5 µm/5 µm, less than or equal to 3 µm/3 µm, or less than or equal to 2 µm/2 µm). The second dielectric layer 242 is formed on the bottom surface of the first dielectric layer 241 to cover the intermediate lower circuit layer 263. The second dielectric layer 242 may be made of a cured photoimageable dielectric material such as epoxy or polyimide (PI) including photoinitiators. In some embodiments, the first dielectric layer 241 and the second dielectric layer 242 may constitute a lower dielectric structure 24.

Figure 11:
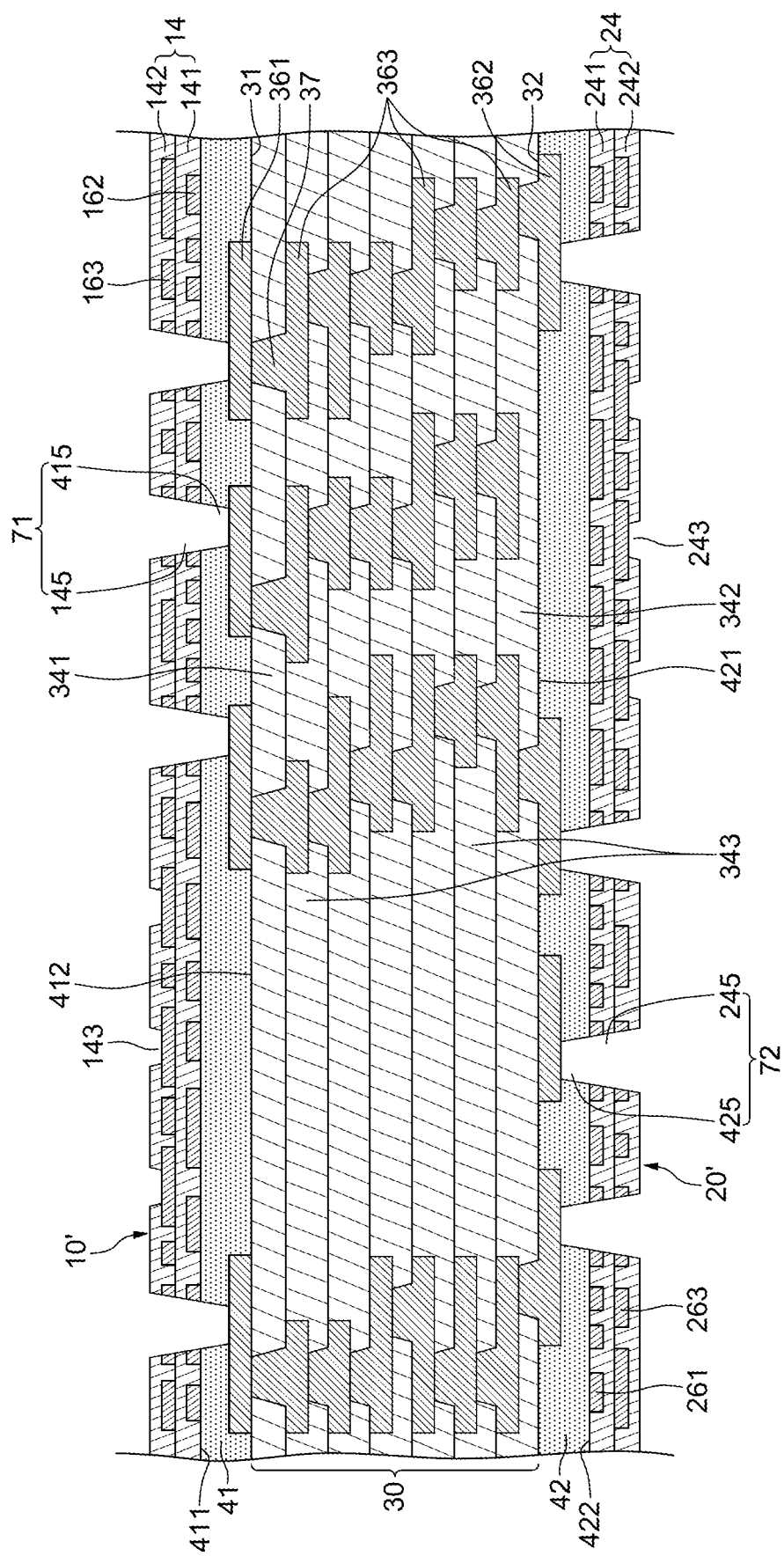
FIG. 11 illustrates one or more stages of an example of a method for manufacturing a wiring structure according to some embodiments of the present disclosure.

Referring to FIG. 11, at least one upper through hole 71 is formed to extend through the upper conductive structure 10' (including, for example, the first dielectric layer 141, the second dielectric layer 142, the bottommost upper circuit layer 162 and the intermediate upper circuit layer 163) and the upper bonding layer 41 to expose a portion of the topmost circuit layer 361 of the conductive structure 30 by, for example, laser drilling; and at least one lower through hole 72 is formed to extend through the lower conductive structure 20' (including, for example, the first dielectric layer 241, the second dielectric layer 242, the topmost lower circuit layer 261 and the intermediate lower circuit layer 263) and the lower bonding layer 42 to expose a portion of the bottommost circuit layer 362 of the conductive structure 30 by, for example, laser drilling. Meanwhile, at least one through hole 145 is formed to extend through the first dielectric layer 141 and the second dielectric layer 142 and at least one through hole 415 is formed to extend through the upper bonding layer 41 after the formation of the upper through hole 71; and at least one through hole 245 is formed to extend through the first dielectric layer 241 and the second dielectric layer 242 and at least one through hole 425 is formed to extend through the lower bonding layer 42 after the formation of the lower through hole 72. That is, the through hole 145 (extending through the first dielectric layer 141 and the second dielectric layer 142) and the through hole 415 of the upper bonding layer 41 may constitute the upper through hole 71, and the through hole 245 (extending through the first dielectric layer 241 and the second dielectric layer 242) and the through hole 425 of the lower bonding layer 42 may constitute the lower through hole 72. Meanwhile, a plurality of upper openings 143 are formed to extend through the second dielectric layer 142 to expose a portion of the intermediate upper circuit layer 163, and a plurality of lower openings 243 are formed to extend through the second dielectric layer 242 to expose a portion of the intermediate lower circuit layer 263.

Figure 12:
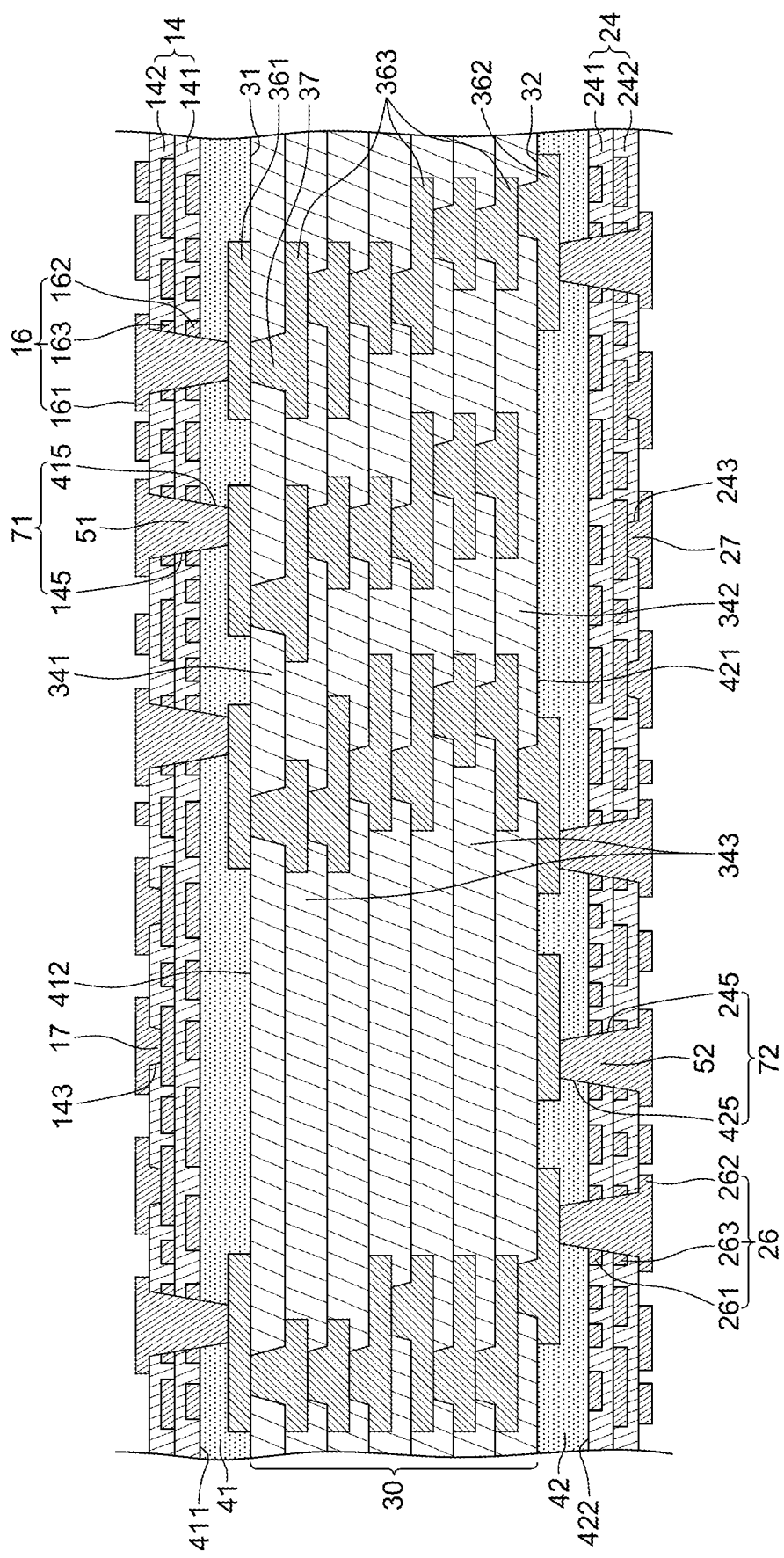
FIG. 12 illustrates one or more stages of an example of a method for manufacturing a wiring structure according to some embodiments of the present disclosure.

Referring to FIG. 12, at least one upper conductive via 51 is formed in the upper through hole 71 and on the exposed portion of the topmost circuit layer 361 of the conductive structure 30 to electrically connect or contact the topmost circuit layer 361; and at least one lower conductive via 52 is formed in the lower through hole 72 and on the exposed portion of the bottommost circuit layer 362 of the conductive structure 30 to electrically connect or contact the bottommost circuit layer 362. Meanwhile, a topmost upper circuit layer 161 is formed on a top surface of the second dielectric layer 142 and electrically connected to the upper conductive via 51, a plurality of upper inner vias 17 are formed in the upper openings 143 and on the exposed portion of the intermediate upper circuit layer 163 to electrically connect the intermediate upper circuit layer 163 and the topmost upper circuit layer 161, a bottommost lower circuit layer 262 is formed on a bottom surface of the second dielectric layer 242 and electrically connected to the lower conductive via 52, and a plurality of lower inner vias 27 are formed in the lower openings 243 and on the exposed portion of the intermediate lower circuit layer 263 to electrically connect the intermediate lower circuit layer 263 and the bottommost lower circuit layer 262. In some embodiments, the topmost upper circuit layer 161, the upper conductive via 51 and the upper inner vias 17 may be formed integrally, and the bottommost lower circuit layer 262, the lower conductive via 52 and the lower inner vias 27 may be formed integrally. In addition, the topmost upper circuit layer 161, the bottommost upper circuit layer 162 and the intermediate upper circuit layer 163 may constitute an upper redistribution layer 16, and the topmost lower circuit layer 261, the bottommost lower circuit layer 262 and the intermediate lower circuit layer 263 may constitute a lower redistribution layer 26.

Figure 13:
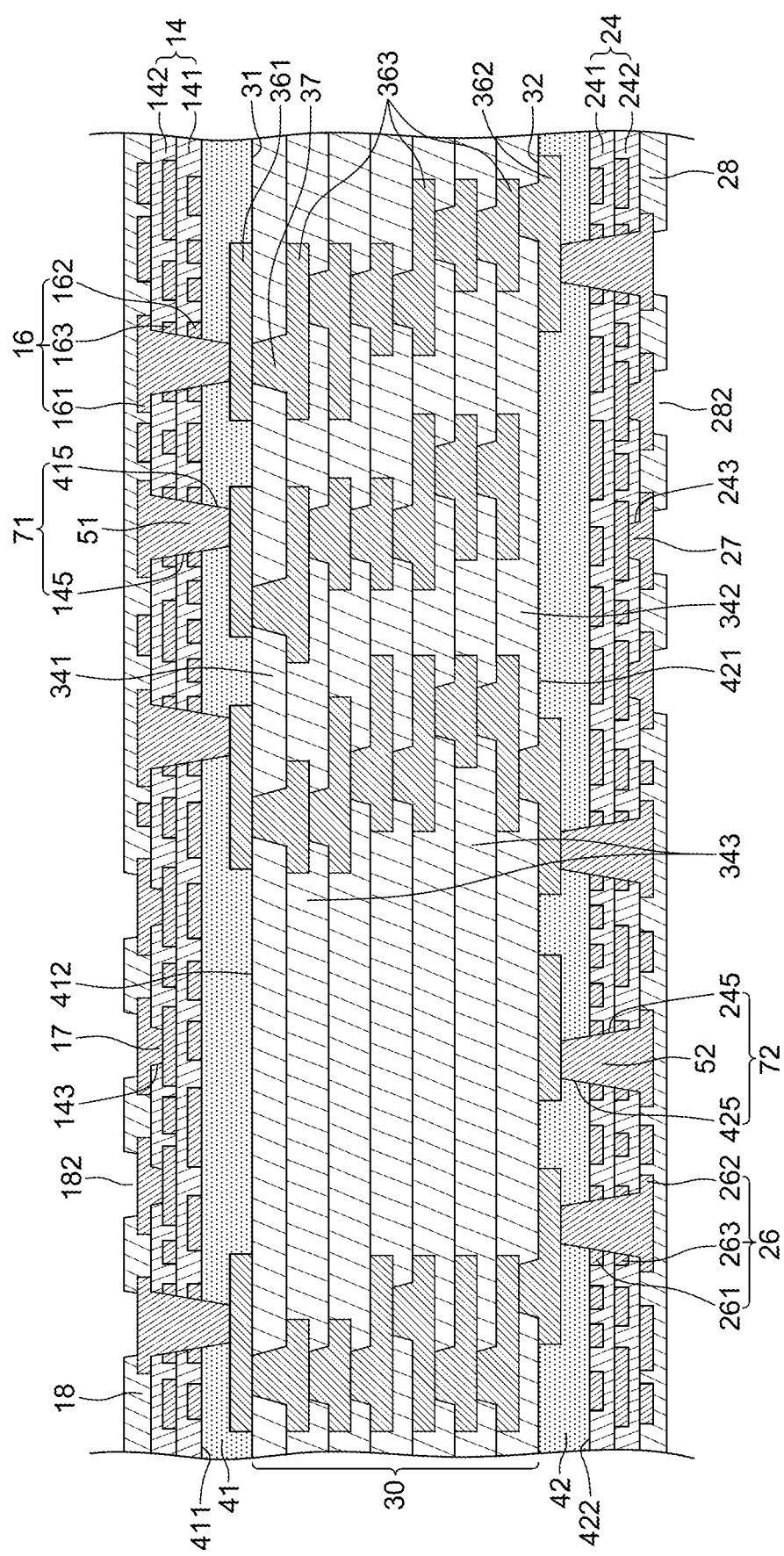
FIG. 13 illustrates one or more stages of an example of a method for manufacturing a wiring structure according to some embodiments of the present disclosure.

Referring to FIG. 13, an upper protection layer 18 (e.g., solder mask) is formed to cover the second dielectric layer 142 and the topmost upper circuit layer 161, and a lower protection layer 28 (e.g., solder mask) is formed to cover the second dielectric layer 242 and the bottommost lower circuit layer 262. In some embodiments, the upper protection layer 18 may define a plurality of openings 182 to expose a portion of the topmost upper circuit layer 161, and the lower protection layer 28 may define a plurality of openings 282 to expose a portion of the bottommost lower circuit layer 262.

Figure 14:
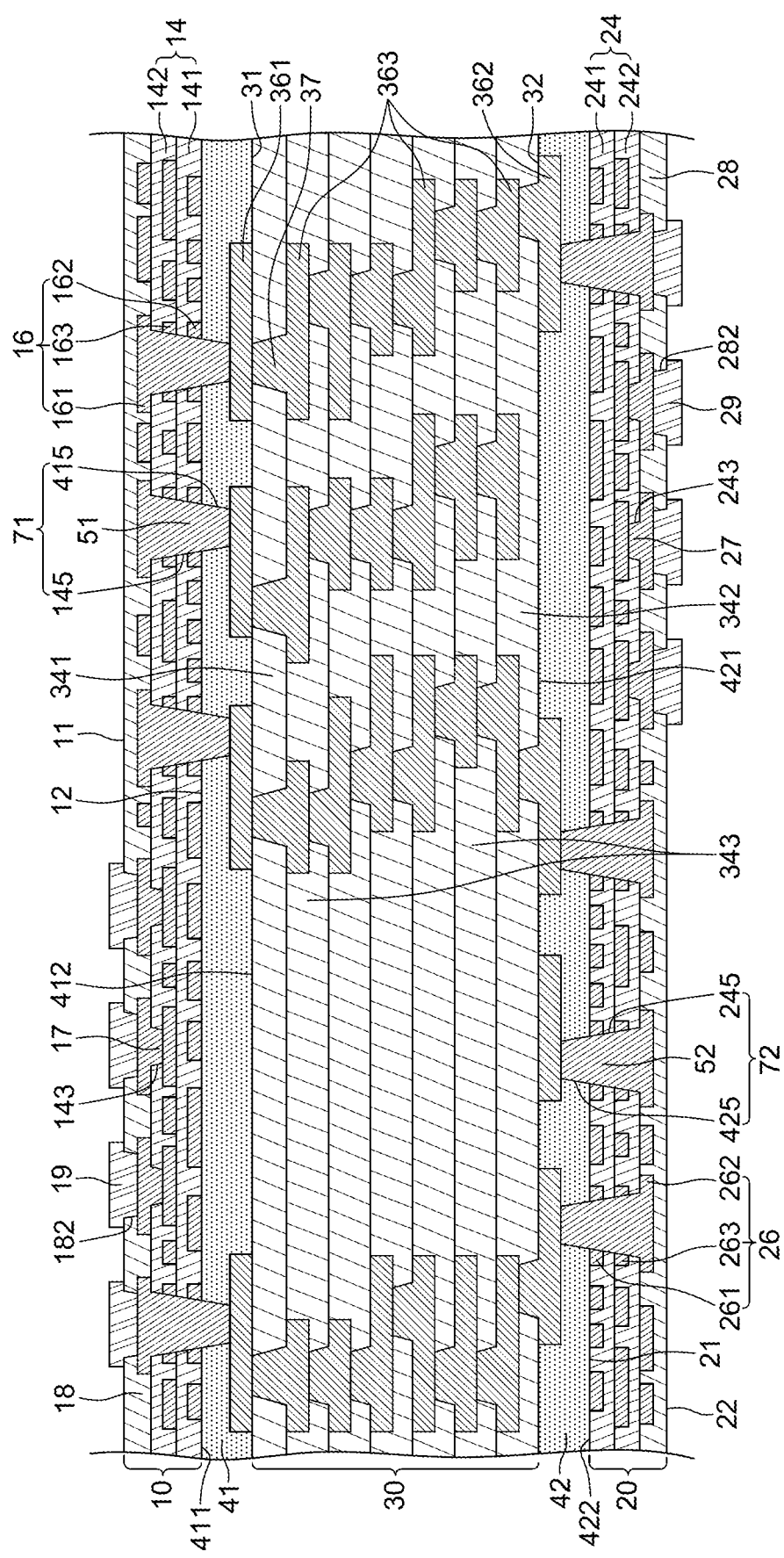
FIG. 14 illustrates one or more stages of an example of a method for manufacturing a wiring structure according to some embodiments of the present disclosure.

Referring to FIG. 14, a plurality of upper connecting pads 19 are formed in the openings 182 of the upper protection layer 18 and on the exposed portion of the topmost upper circuit layer 161 to electrically connect or contact the topmost upper circuit layer 161, and a plurality of lower connecting pads 29 are formed in the openings 282 of the lower protection layer 28 and on the exposed portion of the bottommost lower circuit layer 262 to electrically connect or contact the bottommost lower circuit layer 262. As shown in FIG. 14, the upper dielectric structure 14 (including, for example, the first dielectric layer 141 and the second dielectric layer 142), the upper redistribution layer 16 (including, for example, the topmost upper circuit layer 161, the bottommost upper circuit layer 162 and the intermediate upper circuit layer 163), the upper inner vias 17, the upper protection layer 18 and the upper connecting pads 19 may constitute an upper redistribution structure 10. The lower dielectric structure 24 (including, for example, the first dielectric layer 241 and the second dielectric layer 242), the lower redistribution layer 26 (including, for example, the topmost lower circuit layer 261, the bottommost lower circuit layer 262 and the intermediate lower circuit layer 263), the lower inner vias 27, the lower protection layer 28 and the lower connecting pads 29 may constitute a lower redistribution structure 20.

Then, a singulation process is conducted to obtain a plurality of wiring structures 1 of FIG. 1.

Spatial descriptions, such as "above," "below," "up," "left," "right," "down," "top," "bottom," "vertical," "horizontal," "side," "higher," "lower," "upper," "over," "under," and so forth, are indicated with respect to the orientation shown in the figures unless otherwise specified. It should be understood that the spatial descriptions used herein are for purposes of illustration only, and that practical implementations of the structures described herein can be spatially arranged in any orientation or manner, provided that the merits of embodiments of this disclosure are not deviated from by such an arrangement.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, a first numerical value can be deemed to be "substantially" the same or equal to a second numerical value if the first numerical value is within a range of variation of less than or equal to ±10% of the second numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

Two surfaces can be deemed to be coplanar or substantially coplanar if a displacement between the two surfaces is no greater than 5 μm, no greater than 2 μm, no greater than 1 μm, or no greater than 0.5 μm. A surface can be deemed to be substantially flat if a displacement between a highest point and a lowest point of the surface is no greater than 5 μm, no greater than 2 μm, no greater than 1 μm, or no greater than 0.5 μm.

As used herein, the singular terms "a," "an," and "the" may include plural referents unless the context clearly dictates otherwise.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately 104 S/m, such as at least $10^5$ S/m or at least $10^6$ S/m. The electrical conductivity of a material can sometimes vary with temperature. Unless otherwise specified, the electrical conductivity of a material is measured at room temperature.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. A wiring structure, comprising:
an upper redistribution structure;
a lower redistribution structure;
a conductive structure disposed between and electrically connected to the upper redistribution structure and the lower redistribution structure;
an upper bonding layer disposed between the upper redistribution structure and the conductive structure to bond the upper redistribution structure and the conductive structure together;
a lower bonding layer disposed between the lower redistribution structure and the conductive structure to bond the lower redistribution structure and the conductive structure together; and
at least one upper conductive via extending through at least a portion of the upper redistribution structure and the upper bonding layer, and electrically connected to the conductive structure;
wherein the upper redistribution structure includes a plurality of upper inner vias, the conductive structure includes a plurality of inner vias, and tapering directions of the topmost inner vias of the conductive structure are different from tapering directions of the upper inner vias of the upper redistribution structure.

2. The wiring structure of claim 1, wherein the upper redistribution structure includes an upper redistribution layer, the lower redistribution structure includes a lower redistribution layer, the upper redistribution layer includes a plurality of upper circuit layers, the lower redistribution layer includes at least one lower circuit layer, and a number of the at least one lower circuit layer of the lower redistribution layer is different from a number of the upper circuit layers of the upper redistribution layer.

3. The wiring structure of claim 1, wherein the upper redistribution structure includes an upper dielectric structure and an upper redistribution layer embedded in the upper dielectric structure, the lower redistribution structure includes a lower dielectric structure and a lower redistribution layer embedded in the lower dielectric structure, a ratio of a total thickness of the upper dielectric structure to a total thickness of the lower dielectric structure is 0.58 to 3, and a ratio of a total thickness of the upper redistribution layer to a total thickness of the lower redistribution layer is 0.3 to 3.

4. The wiring structure of claim 1, wherein the upper redistribution structure includes an upper redistribution layer, the lower redistribution structure includes a lower redistribution layer, the upper redistribution layer includes a plurality of upper circuit layers, the lower redistribution layer includes at least one lower circuit layer, the conductive structure includes a plurality of circuit layers, and a line width of the upper circuit layer of the upper redistribution layer and a line width of the lower circuit layer of the lower redistribution layer are less than a line width of the circuit layer of the conductive structure.

5. The wiring structure of claim 1, wherein the upper redistribution structure includes an upper redistribution layer, the lower redistribution structure includes a lower redistribution layer, the upper redistribution layer includes a plurality of upper circuit layers, the lower redistribution layer includes at least one lower circuit layer, the conductive structure includes a plurality of circuit layers, and a thickness of the upper circuit layer of the upper redistribution layer and a thickness of the lower circuit layer of the lower redistribution layer are less than a thickness of the circuit layer of the conductive structure.

6. The wiring structure of claim 1, further comprising at least one lower conductive via, wherein the lower conductive via extends through at least a portion of the lower redistribution structure and the lower bonding layer, and electrically connected to the conductive structure.

7. The wiring structure of claim 6, wherein the upper redistribution structure includes an upper redistribution layer, the lower redistribution structure includes a lower redistribution layer, the upper redistribution layer includes a plurality of upper circuit layers, the lower redistribution layer includes a plurality of lower circuit layers, the conductive structure includes a plurality of circuit layers, the upper conductive via extends through a bottommost upper circuit layer of the upper redistribution layer and is electrically connected to a topmost circuit layer of the conductive structure, and the lower conductive via extends through a topmost lower circuit layer of the lower redistribution layer and is electrically connected to a bottommost circuit layer of the conductive structure.

8. The wiring structure of claim 1, wherein a size of the upper redistribution structure is less than a size of the conductive structure.

9. The wiring structure of claim 1, wherein a size of the lower redistribution structure is less than a size of the upper redistribution structure.

10. The wiring structure of claim 1, wherein a peripheral surface of the lower redistribution structure and a peripheral surface of the lower bonding layer are non-coplanar with a peripheral surface of the conductive structure.

11. The wiring structure of claim 1, wherein a size of the lower redistribution structure and a size of the lower bonding layer are different from a size of the conductive structure.

12. The wiring structure of claim 1, wherein the upper redistribution structure includes an upper dielectric structure, the lower redistribution structure includes a lower dielectric structure, the conductive structure includes a plurality of stacked dielectric layers, a material of the upper dielectric structure of the upper redistribution structure and a material of the lower dielectric structure of the lower redistribution structure are cured photoimageable dielectric material, and a material of each of the dielectric layers of the conductive structure is non-photoimageable dielectric material.

13. The wiring structure of claim 1, wherein the upper redistribution structure includes an upper redistribution layer, the upper redistribution layer includes a plurality of upper circuit layers, the conductive structure includes a plurality of circuit layers, and the upper conductive via extends through a bottommost upper circuit layer of the upper redistribution layer and is electrically connected to a topmost circuit layer of the conductive structure.

14. The wiring structure of claim 1, wherein the topmost inner vias of the conductive structure taper upward, and the upper inner vias of the upper redistribution structure taper downward.

15. The wiring structure of claim 1, wherein tapering directions of the inner vias of the conductive structure are the same.

16. The wiring structure of claim 1, wherein the conductive structure is a coreless substrate.

17. The wiring structure of claim 1, wherein the upper redistribution structure includes an upper dielectric structure, the upper inner vias taper downward from a top surface of the upper dielectric structure, and the upper conductive via tapers downward from the top surface of the upper dielectric structure to a topmost circuit layer of the conductive structure.

18. A wiring structure, comprising:
- an upper redistribution structure including an upper dielectric structure and a plurality of upper circuit layers;
- a conductive structure electrically connected to the upper redistribution structure, and including a plurality of circuit layers and a plurality of inner vias;
- an upper bonding layer disposed between the upper redistribution structure and the conductive structure to bond the upper redistribution structure and the conductive structure together; and
- at least one upper conductive via extending through at least a portion of the upper redistribution structure and the upper bonding layer, and electrically connected to the conductive structure, wherein the topmost inner vias of the conductive structure taper upward, and the upper conductive via tapers downward from a top surface of the upper dielectric structure to a topmost circuit layer of the conductive structure.

19. The wiring structure of claim 18, further comprising a lower redistribution structure electrically connected to the conductive structure, wherein the upper redistribution structure and the lower redistribution structure are bumping level redistribution structures, and the conductive structure is a substrate level conductive structure.

20. The wiring structure of claim 18, further comprising a lower redistribution structure and a lower bonding layer, wherein the lower bonding layer is disposed between the lower redistribution structure and the conductive structure to bond the lower redistribution structure and the conductive structure together.

* * * * *